United States Patent
Fasching et al.

(10) Patent No.: US 11,131,717 B1
(45) Date of Patent: Sep. 28, 2021

(54) METHODS AND SYSTEMS FOR IN-SITU LEAKAGE CURRENT TESTING OF CELLS IN MULTI-CELL BATTERY PACKS

(71) Applicant: Element Energy, Inc., San Francisco, CA (US)

(72) Inventors: Rainer Johannes Fasching, Mill Valley, CA (US); Georgy Zerkalov, Santa Clara, CA (US); Arnaud Devie, Hawthorne, CA (US); Seth Marshall Kahn, San Francisco, CA (US); Anthony John Stratakos, San Anselmo, CA (US); Corrado Cammi, Sunnyvale, CA (US); Anderson Rennie John, Santa Clara, CA (US); Yoosok Saw, Seoul (KR)

(73) Assignee: Element Energy, Inc., San Francisco, CA (US)

( * ) Notice: Subject to any disclaimer, the term of this patent is extended or adjusted under 35 U.S.C. 154(b) by 0 days.

(21) Appl. No.: 16/996,501

(22) Filed: Aug. 18, 2020

(51) Int. Cl.
| | |
|---|---|
| G01R 31/396 | (2019.01) |
| G01R 31/52 | (2020.01) |
| H01M 10/42 | (2006.01) |
| H02J 7/00 | (2006.01) |

(52) U.S. Cl.
CPC ........ *G01R 31/396* (2019.01); *G01R 31/52* (2020.01); *H01M 10/4228* (2013.01); *H02J 7/0048* (2020.01)

(58) Field of Classification Search
CPC . H01M 10/4228; G01R 31/396; G01R 31/52; H02J 7/0048
See application file for complete search history.

(56) References Cited

U.S. PATENT DOCUMENTS

| | | | |
|---|---|---|---|
| 5,729,116 A * | 3/1998 | Tsenter | H02J 7/00711 320/155 |
| 8,686,693 B2 | 4/2014 | Bhowmik et al. | |
| 9,397,502 B2 | 7/2016 | Weir et al. | |
| 10,283,974 B2 | 5/2019 | Macris | |
| 2011/0003182 A1* | 1/2011 | Zhu | H01M 10/482 429/50 |
| 2012/0119746 A1* | 5/2012 | Macris | G01R 31/3842 324/431 |
| 2019/0036373 A1* | 1/2019 | Shimura | H01M 10/0525 |
| 2019/0302863 A1* | 10/2019 | Chandra | G06F 1/3212 |

* cited by examiner

*Primary Examiner* — Mayla Gonzalez Ramos
(74) *Attorney, Agent, or Firm* — Kwan & Olynick LLP

(57) ABSTRACT

Described methods and systems provide in-situ leakage current testing of battery cells in battery packs even while these packs operate. Specifically, an external electrical current is discontinued through a tested battery cell using a node controller, to which the tested battery cell is independently connected. Changes in the open circuit voltage (OCV) are then detected by the node controller for a set period time. Any voltage change, associated with taking the tested cell offline, is compensated by one or more other cells in the battery pack. The overall pack current and voltage remains substantially unchanged (based on the application demands), while the in-situ leakage current testing is initiated, performed, and/or completed. The OCV changes are then used to determine the leakage current of the tested cell and, in some examples, to determine the state of health of this cell and/or adjust the operating parameters of this cell.

20 Claims, 17 Drawing Sheets

METHODS AND SYSTEMS FOR IN-SITU LEAKAGE CURRENT TESTING OF CELLS IN MULTI-CELL BATTERY PACKS

BACKGROUND

Multi-cell battery packs are used for various applications. While individual battery cells, forming a pack, typically have the same design, these cells may exhibit some differences in performance characteristics, such as self-discharge. Self-discharge is an inherent characteristic, which can be influenced by manufacturing, age, cycling parameters, temperatures, and others. Specifically, self-discharge is caused by an internal leakage current, which comes from limits on electric insulation between the two electrodes in the cell. Self-discharge variations (e.g., among different cells in the same battery pack and/or change for the same cell after some time) may be used to monitor the state of health and/or the state of safety of the cells and the overall battery pack. Furthermore, in some examples, self-discharge variations may potentially cause a state of charge (SOC) imbalance, e.g., for nickel-metal hydride and nickel-cadmium cells.

While accurately measuring self-discharge of cells in battery packs is desirable, this type of measurement is very challenging and typically not possible when the battery packs are in operation. Accurate measurement of a cell leakage current requires taking this cell offline and not passing any external current through the cell, often for a prolonged time. Conventional battery packs do not allow taking cells offline, e.g., when the pack is charged or discharged, which may be referred to as in-situ testing. At the same time, many applications of battery packs (e.g., electric vehicles, grid energy storage) may prevent taking the entire battery pack offline to measure the leakage current of individual cells, which may be referred to as offline testing. Many applications prevent prolonged and predictable offline modes. Furthermore, conventional battery management systems (BMS) connected to cells in battery packs often load the cells with a quiescent current that is larger than the leakage currents of the cells. Self-discharge is also typically different for different SOCs and/or other conditions, such as temperature. Accounting for these conditions is far beyond the capabilities of conventional BMS. Furthermore, conventional BMS are not capable of identifying individual unsafe cells or, more specifically, identify specific degradation modes of individual cells (e.g., based on leakage current results). Finally, bringing an off-line cell back online is challenging and typically requires SOC balancing with other cells, which is also beyond the capabilities of conventional BMS.

What is needed are novel methods and systems for in-situ leakage current testing of battery cells in multi-cell battery packs.

SUMMARY

Described methods and systems are used for in-situ leakage current testing of battery cells in battery packs even while these packs operate. Specifically, an external electrical current is discontinued through a cell using a node controller, to which this tested cell is independently connected. Changes in the open circuit voltage (OCV) are monitored to determine the leakage current of this cell. Changes in a cell's contribution to a pack's voltage and power output, associated with taking the tested cell offline, is compensated by one or more other cells in the pack. The overall pack voltage remains substantially unchanged while the tested cell is taken offline and later when the cell is brought back online. The leakage current data is to determine the state of health, state of safety, and/or one or more degradation modes of this cell and, in some examples, to adjust the operating parameters of this cell.

In some examples, a method for in-situ leakage current testing of battery cells in a battery pack is provided. The method comprises discontinuing an external cell current through a first battery cell of a first battery node while the battery pack remains operational and providing power output. The method further comprises determining leakage current of the first battery cell based on cell data obtained from the first battery cell.

In some examples, a battery pack, configured for in-situ leakage current testing of battery cells in the battery pack is provided. The battery pack comprises a first battery node, comprising a first node controller and a first battery cell, electrically coupled to the first node controller. The first node controller is configured to discontinue an external cell current through the first battery cell while the battery pack remains operational and providing power output. The battery pack also comprises a second battery node, comprising a second node controller and a second battery cell, electrically coupled to the second node controller. The battery pack comprises a bus, electrically interconnecting the first node controller and the second node controller, and a battery pack controller, communicatively coupled to the first node controller and the second node controller. At least one of the first node controller or battery pack controller is configured to determine leakage current of the first battery cell.

DETAILED DESCRIPTION

Figure 1A:
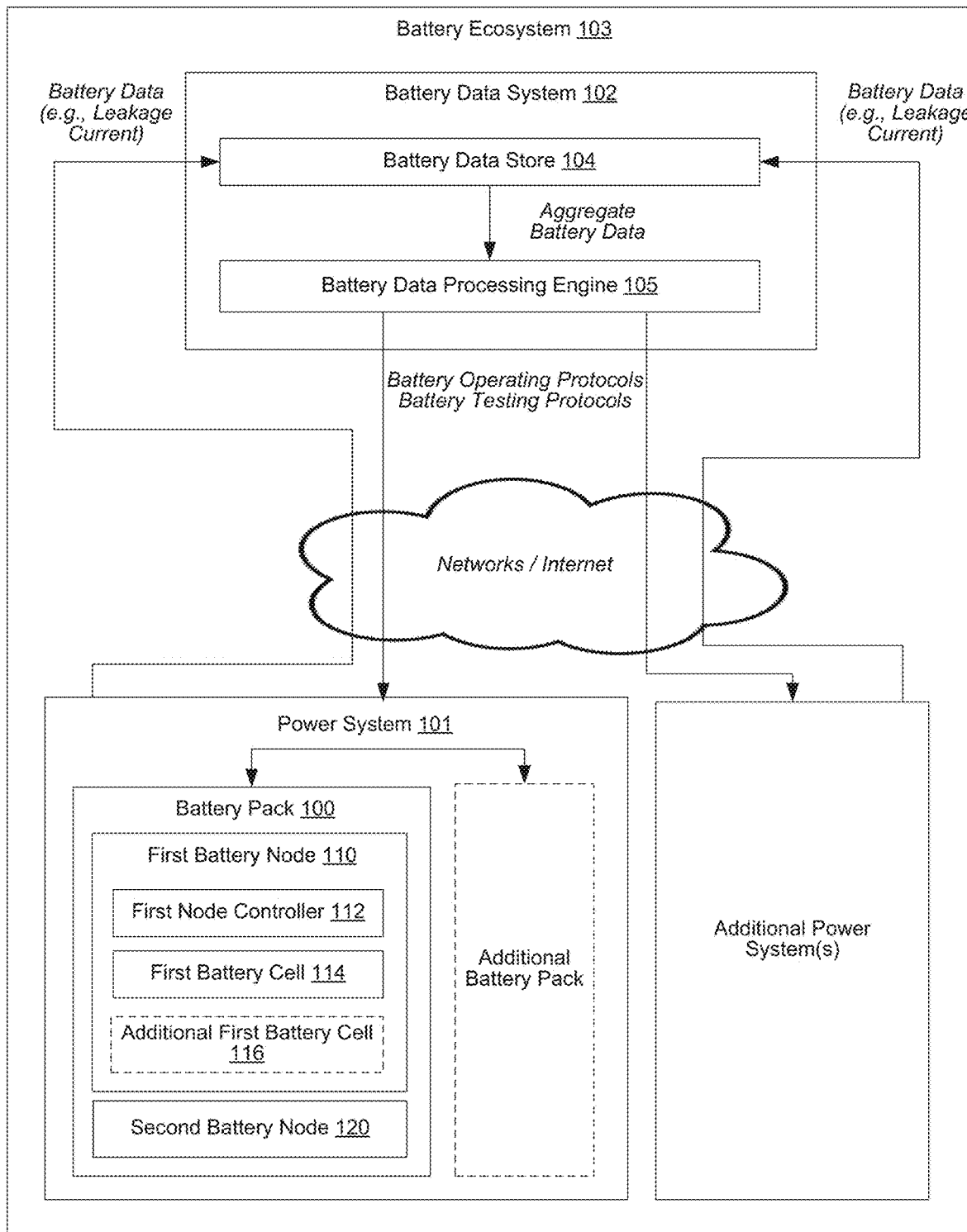
FIG. 1A is a schematic block diagram of a battery ecosystem, used for collecting and analyzing battery data from multiple power systems and developing new battery operating procedures and/or new battery testing protocols for these power systems, in accordance with some examples.

In the following description, numerous specific details are outlined to provide a thorough understanding of the presented concepts. In some examples, the presented concepts are practiced without some or all of these specific details. In other instances, well-known process operations have not been described in detail to not unnecessarily obscure the described concepts. While some concepts will be described in conjunction with the specific examples, it will be understood that these examples are not intended to be limiting.

INTRODUCTION

Self-discharge is an inherent characteristic of battery cells, caused by internal electrical currents within these cells. These internal currents are also referred to as leakage currents, which are used to characterize self-discharge. While leakage currents are not desirable, they are often unavoidable. Furthermore, leakage currents can change over time (e.g., as battery cells age). Finally, detecting leakage currents can be challenging.

In some examples, leakage currents vary among cells in the same battery pack. For example, battery cells of the same type (e.g., the same design, chemistry, and manufacturer) may have different leakage current characteristics resulting from unintended variations in materials, assemblies, and testing. Furthermore, different cells in the same battery pack may be subjected to different operating conditions (e.g., temperature, SOC) resulting in different levels of degradation, which affects the leakage current characteristics. The leakage current is a major indicator of the cell's degradation or lack thereof, which may be referred to as a cell's state of health (SOH) and which is also indicative of a cell's state of safety (SOS). The leakage current, if identified with sufficient precision and at certain cell conditions (e.g., temperature, SOC), can provide a strong indication of different degradation modes (or, more specifically, failure modes) of the cell, such as internal mechanical shorts, gas evolution on positive electrodes, irregularities on solid electrolyte interface (SEI) layers, metal dendrite formations on negative electrodes, and others. In some examples, a specific degradation mechanism and/or a failure mode of the cell can be identified from the corresponding leakage current data.

In some examples, the leakage current of a cell is detected based on OCV changes over time, often a relatively long time. The leakage current causes the cell to self-discharge, thereby reducing the SOC of the cell. As the SOC drops, the OCV of the cell also changes. As such, to determine the leakage current based on OCV changes, the cell is taken offline such that no external currents pass through the cell, and two or more OCV measurements can be performed. In some examples, the cell is taken offline for a substantial time (e.g., at least one day, at least one week) while the battery pack remains operational. This period depends on the leakage current, desired test accuracy, equipment precision, and other factors (e.g., types of cell, temperature, SOC). For example, a typical lithium-ion cell exhibits a 1%-10% drop in the SOC in the first 24 hours after being fully charged due to the relaxation effect, corresponding to an equivalent leakage current of about $10^{-3}$ C to $10^{-2}$ C. The SOC drop then reduces to 1-2% per month, corresponding to the leakage current of between about $10^{-4}$ C to $10^{-5}$ C (with 1 C corresponding to a cell being charged from 0% SOC to 100% SOC in 1 hour). However, OCV values may only change by $10^{-3}$V to $10^{-2}$V over 1-10 days, especially for cells with low leakage currents (e.g., new cells). One having ordinary skill in the art would understand that the values presented above are for illustration purposes only and are not intended to be limiting. Overall, leakage current testing may take long periods and precise equipment for monitoring OCV. While the current disclosure focuses on OCV monitoring as an example of determining leakage current, other methods of leakage current testing are also within the scope. In another example, a cell in a selected SOC (e.g., a fully charged state or some intermediate SOC, which is known with sufficient precision) is disconnected for some time, after which the cell is charged back to this selected SOC. The charge amount needed to bring the cell back to the fully charged state (or other precisely known intermediate SOC) indicates the leakage current. In another example, a cell is maintained at a constant voltage or, more specifically, a selected SOC, by supplying a small amount of current to the cell, which may be referred to as a recharging current. This amount of recharging current corresponds to the leakage current.

At the same time, most conventional battery applications and battery pack designs do not allow isolating individual cells for long periods, which may be needed for leakage current testing (e.g., OCV monitoring). For example, even if a battery pack is idle, certain connections in conventional battery packs (e.g., parallel connections) may limit OCV monitoring of individual cells. Aggregate leakage current data (e.g., from multiple cells) does not allow assessing the SOH of individual cells with sufficient precision. Furthermore, predicting the duration of a battery pack being idle (i.e., not operational) is often not possible, while restricting the battery pack operations for prolonged periods may not be feasible. This problem with conventional battery packs becomes even more complex when OCV monitoring is required at a particular SOC, which may be needed for determining specific degradation modes. For example, it may not be possible to determine when a battery pack will be at a certain SOC and, at the same time, will not be operational for a prolonged period, as may be required for leakage current testing.

Described methods and systems allow in-situ leakage current testing of individual battery cells in battery packs. For purposes of this disclosure, "in-situ testing" is defined as testing performed while the battery pack remains operational and continues to operate, e.g., being charged or discharged to receive charging power or provide power output to an external load. In-situ testing should be distinguished from offline testing, e.g., when the entire battery pack is taken offline and is not operational (e.g., disconnected from the external load).

In some examples, the in-situ testing is performed without any changes to the overall pack operation parameters (e.g., to the pack voltage and/or to the pack power output). Specifically, during the in-situ leakage current testing, one or more cells are taken offline for leakage current testing, while the pack continues to operate in a similar manner (e.g., as demanded by the external load). The power contributions of these tested cells (to the overall pack power output) may be compensated by one or more other cells in the pack. These other cells are operated per specific compensation profiles, which may be also referred to as a power compensation profile. As a result, the battery pack continues to operate without any disruptions (e.g., providing the same level of power). It should be noted that the pack voltage and current may be varied during testing even though the power output remains the same. It should be noted that the SOC, power, voltage, and/or current of the battery pack may change while performing in-situ leakage current testing, e.g., based on different power demands from the battery pack. However, these changes are driven by the application requirement of the battery pack (e.g., power demands) rather than by in-situ leakage current testing. It also should be noted that taking one or more cells offline (for in-situ leakage current testing) and then bringing these cells back online (after completing the in-situ leakage current testing) does not impact the overall operation of the battery pack.

When one or more battery cells are taken offline and tested, no charge or discharge currents are applied to these tested cells. In other words, the external cell current through each of the tested cells is discontinued. This external cell current should be distinguished from the leakage current, which is internal to the cell and generally cannot be controlled, at least not in the same manner as the external cell current. The external cell current should be also distinguished from a test current, which may be used for leakage current testing (e.g., charging a tested cell with a current equivalent to a leakage current to maintain the same SOC of the tested cell). The external cell current contributes to the power output of the battery pack while the pack charges or discharges.

In some examples, once one or more battery cells are taken offline by discontinuing external currents through these cells, two or more OCV measurements are taken for each of these tested cells over a time period to determine the leakage current of this cell. In more specific examples, multiple OCV measurements are taken, e.g., to establish an OCV profile or a time series. In some examples, the duration of the test is initially unknown. Instead, the duration is dynamically established based on the measured OCV changes and the desired test precision. Furthermore, in some examples, in-situ leakage current testing is repeated for different SOCs, different cell temperatures, and/or other like factors. In some examples, the process may involve capturing a temperature profile corresponding to a captured OCV profile, e.g., measure both the OCV and temperature of the cell over a test period. Furthermore, the temperature profile is taken into account when analyzing the OCV profile. The effects of temperature on the leakage current are described below with reference to FIG. 4C.

When a battery cell is taken offline (i.e., removed from the operation of the battery pack and tested with no external cell current passing through the battery cell), the battery cell stops contributing to the total power output of the battery pack. While various references are made to "power output" of a battery pack/cell, one having ordinary skill in the art would understand that this term encompasses both the power supplied and the power received by the battery pack/cell. For example, in-situ leakage current testing may be performed while charging or while discharging the battery cell. Furthermore, the overall operation continuity during individual cell testing may be expressed in terms of the pack voltage, which remains substantially the same while changing the current through one or more battery cells.

As noted above, the change in the power output contribution from the tested cell is offset and compensated by one or more other cells in the battery pack. These one or more cells may be referred to as power compensating cells and may include cells from the same nodes (as the tested cell) and/or different nodes. As such, during in-situ leakage current testing, a battery pack includes one or more tested cells and one or more power compensating cells. In more specific examples, the battery pack also includes one or more other cells, which are neither tested nor used for power compensation. These other cells may be referred to as regular operating cells. Alternatively, all cells that are not tested for leakage current are compensating cells, e.g., equally distributing the power compensation.

It should be noted that the leakage current testing of a particular cell may be initiated based on various triggers. Some examples of these test triggers include, but are not limited to, operating history (e.g., reaching or exceeding one or more operating limits, such as cut off voltages and/or charge rates) of this cell or of the pack as a whole (e.g., after a high rate charge or discharge, after being exposed to high temperature), test history (e.g., previous leakage current and/or other data, identified degradation modes and severity of these degradation modes) of this cell or the pack as a whole, current conditions of the cell and/or the power pack (e.g., SOC, temperature, OCV, voltage under a certain load), data analysis (e.g., of test and other data from battery cells equivalent to first battery cell 114), and other like trigger points. For purposes of this disclosure, equivalent battery cells are defined as cells with the same design (e.g., materials, form-factor) or at least the cells sharing one or more common characteristics (e.g., materials). For example, a leakage current testing is triggered after a high-rate charge of the cell, upon reaching a certain SOC (e.g., at least 90%). In more specific examples, the minimum SOC threshold is used, e.g., because the leakage current is more detectable at the higher SOC. Furthermore, a cell with a high SOC has enough remaining capacity when the cell is brought back online and used to supply the power to the power pack. Furthermore, the leakage current measurement at a high SOC (at least 90% of the maximum operating capacity) may be used to determine specific degradation mechanisms as further described below. Testing may be performed at a specific SOC corresponding to a tested degradation mode.

Some examples of these degradation mechanisms include, but are not limited to, oxidation on positive electrodes, reduction on negative electrodes (e.g., gassing), and/or presence or development of mechanical shorts in the cell (e.g., dendrites, loose particles). Other degradation mechanisms include dissolution and/or cracking of negative electrode substrates, corrosion of positive electrode substrates, loss of contact with negative electrode substrates and/or positive electrode substrates, SEI decomposition and precipitation, excessive SEI formation, cracking of active material particles, the formation of cathodic surface films, polymer binder decomposition, and others. As further described below, these results may be used for various purposes, e.g., changing frequency of future tests, performing different types of test schedule, service/maintenance/replacement of the battery pack, permanently or temporarily bypass the cell, changing operating parameters of the cell, the node, and/or the pack, such as cut off voltages and/or charge rates. In some examples, operating parameters may be also referred to as operating limits (e.g., maximum charge/discharge rates).

For example, in a lithium-ion cell, a standard discharge corresponds to lithium ions de-intercalating from the negative electrode, migrating to the positive electrode through the separator and intercalating into the positive electrode, as represented by the following formulas:

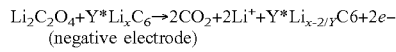
(negative electrode)

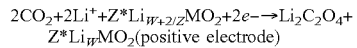
$Z^*Li_WMO_2$(positive electrode)

The process is reversed during a charge. At the same time, electrons travel through the external load, with a 1-to-1 ratio between the lithium-ion transfer and the electron transfer.

During a self-discharge, there is no external pathway for the conduction of electrons. Instead, a shuttle mechanism takes place internally between the two electrodes. For instance, decomposition byproduct ($CO_2$) of the oxidation of electrolyte at the positive electrode can migrate to the negative electrode. Upon reaching the negative electrode, this byproduct is reduced in a reaction that consumes two lithium ions and two electrodes from the negative electrode, as represented by the following formula:

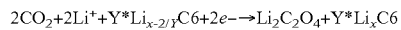

The byproduct ($Li_2C_2O_4$) of this reduction reaction then migrates to the positive electrode where this byproduct gets oxidized and provides two Lithium ions and two electrons to the positive electrode, as represented by the following formula:

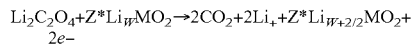

One having ordinary skill in the art would understand that the above description represents a general framework of self-discharge within lithium-ion cells.

In some examples, an SEI layer is damaged (e.g., due to high temperature, high-rate charge/discharge operations). When the SEI layer is damaged, highly reactive particles of the negative electrodes (in the damaged portion) are exposed to and interface the electrolyte. The electrolyte gets reduced at this interface with the negative electrode to form a fresh SEI layer, effectively to repair the damaged area. In this reduction/repair reaction, lithium ions and electrons are sourced from the negative electrode as represented by the following formula:

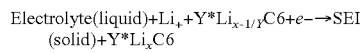

A decrease in the lithium concentration in the negative electrode raises the potential of the negative electrode, which in turn translates into a decrease in the OCV of the cell, which can be measured. As such, in some examples, the OCV decrease is an indication of an SEI damage/repair process.

In some examples, when the lithium metal plates on the negative electrode, a portion of electrolyte interfaces highly reactive metallic lithium. The electrolyte gets reduced at the interface with the metallic lithium to form a new SEI layer to passivate the surface of the plated lithium. In this reduction reaction, presented below, lithium ions and electrons are sourced from the plated lithium and represented by the same formula as the one. As with the SEI layer damage, there is a decrease in the lithium concentration in the negative electrode, which in turn translates into a decrease in the OCV of the cell, which can be detected using the methods and systems described herein. Various examples of degradation mode detection are described below with reference to FIGS. 5A-7B.

In some examples, when lithium plating reaches a certain level, lithium dendrites form on the negative electrode. At a certain size, the lithium dendrites can pierce through the separator and create an electrically conductive bridge between the two electrodes, which allows electrons to flow from the negative electrode to the positive electrode within the cell. When electrons are transferred in that manner, lithium-ions de-intercalate from the negative electrode, migrate toward the positive electrode and intercalate into the positive electrode. This overall process corresponds to the drop in the SOC, which is evident from the OCV decrease and which can be detected during in-situ leakage current testing. In some examples, internal shorts are caused by various particles or debris inside the cell, e.g., current collector burrs, electrode flakes, and others. Furthermore, in some examples, internal shorts are caused by mechanical damage and/or an over-pressure event, which causes direct contact to be established between both electrodes by compressing the separator. In some examples, the external terminals of a cell are shorted externally, which creates an electrically conductive bridge between the two electrodes, like the internal shorts described above.

Overall, repeated testing of leakage current at different cell conditions (e.g., SOC, temperature, etc.) on individual cells can assist in the early detection of different degradation mechanisms. The early detection allows implementing various mitigation plans, such as scheduling predictive maintenance operations and/or determining new operating parameters at the individual cell level. For example, leakage current may be used to determine when certain cells and/or nodes should be kept offline (e.g., completely bypassed) even after completion of in-situ leakage current testing and during operations. More specifically, if a measured leakage current for a cell is larger than a set threshold, then the cell is first controllably discharged and taken offline. Alternatively, a test result may be used to determine less stressful operating parameters (e.g., reduced current rates and power levels, different cut off voltages) for one or more cells in the battery pack. In some examples, each cell may be operated according to its individual set of operating parameters, which are developed and updated based on periodic in-situ leakage current testing of this cell.

The results of leakage current testing may be used at a pack level, e.g., by a battery pack controller, to adjust operating parameters of the tested cell. Furthermore, the results may be shared in a battery ecosystem and collectively used together, e.g., with data from other battery packs/across a fleet of power systems comprising battery packs, equivalent to the battery pack with the tested cell. For example, a battery pack may be a part of a power system (e.g., an electric vehicle, a power backup system). Each power system may contain one or more battery packs. The power system, or the battery pack directly, may supply various battery data (e.g., results of leakage current testing) to a central battery data store. The aggregate data in this central battery data store is collectively analyzed to determine various global trends and anomalies, identify specific design concerns, pinpoint production batches with potential defects, and other purposes. This global data analysis may be referred to as a big data analysis because this analysis involves data across multiple battery packs. This analysis may yield various new battery operating protocols and/or battery testing protocols. Furthermore, the analysis may yield various recommendations related to battery designs (e.g., materials, construction, and others). Additional examples of global data analysis are described below with reference to FIG. 2A.

Battery Ecosystem Examples

As noted above, multiple battery cells are often assembled into a battery pack to provide higher power output and/or higher energy storage capacity. Battery packs, in turn, are often used as parts of various higher-level power systems, such as electric vehicles, stationary energy storage systems, grid balancing systems, and others. In some examples, one power system comprises multiple battery packs.

Many modern power systems have communication capabilities for receiving and sharing information. In some examples, these communication capabilities are used for receiving and sharing information related to battery pack operation or, more specifically, to operation and testing of individual cells assembled into the packs. Some examples of this information include, but are not limited to, leakage current testing results, leakage current testing protocols, power compensation protocols, cell operating protocols (e.g., for particular leakage current and/or degradation mode results), outlier (or unsafe) cell identification, degradation-mode determination protocols (e.g., described below with references to FIGS. 5A-7B), fault reaction, and others. This information may be collectively referred to as battery data.

In some examples, the battery data (from multiple different power systems) is aggregated to perform data analysis for multiple different battery cells, multiple different power packs, and/or multiple different power systems. The aggregate data analysis has multiple additional benefits in comparison, e.g., to the data analysis of an individual cell. For example, an aggregate data analysis may involve data from cells having different cycle lives, which provides various insights into cell aging (e.g., changing in leakage current over the operating lifetime). In another example, an aggregate data analysis may involve data from cells operated at different parameters (e.g., charge rates, temperatures, cutoff voltages), which provides insights into effects of these operating parameters on the SOH and/or SOS of the cells. Other examples of aggregate data analysis are also within the scope. In general, information about one set of battery cells (and battery packs formed from these cells) may be relevant for another set of battery cells. For example, battery cells in both sets may be of the same type.

Overall, aggregate battery data and aggregate data analysis may be used to identify unsafe cells and cells with reduced performance capabilities, identify ways of mitigating risks and performance degradation associated with these cells (e.g., taking cells offline, developing new operating protocols/strategies), new test protocols, new battery cell and/or pack designs, and others. For purposes of this disclosure, the sharing of battery data among different power systems is performed within a battery ecosystem. A battery ecosystem may be managed by a manufacturer of power systems (e.g., electric vehicles), a consortium of different manufacturers, a third party, and others.

FIG. 1A is a schematic illustration of battery ecosystem 103, in accordance with some examples. Battery ecosystem 103 comprises power system 101 and, optionally, one or more additional power systems. Each of these power systems comprises at least one battery pack. For example, FIG. 1A illustrates power system 101 comprising battery pack 100 and an optional additional battery pack. Any number of packs in a power system and any number of power systems within a battery ecosystem are within the scope. Battery pack 100 comprises multiple battery nodes, such as first battery node 110 and second battery node 120, as further described below with reference to FIG. 1B.

Battery ecosystem 103 also comprises battery data system 102, which is communicatively coupled (e.g., via various networks and/or internet) to each of the power systems, such as power system 101. Battery data system 102 comprises battery data store 104 and battery data processing engine 105. Battery data store 104 is configured to receive battery data (e.g., results of leakage current testing) from various power systems and store this battery data. This battery data, in battery data store 104, may be referred to as aggregate battery data. In some examples, this aggregate battery data comprises individual cell data (e.g., results of leakage current testing of individual cells). In more specific examples, this aggregate battery data also comprises pack level data and/or power system-level data.

Battery data store 104 also provides this aggregate battery data to battery data processing engine 105 for various types of analysis, such as deterministic analysis, outlier detection, classification, linear regression, forecasting, histogram generation, and others. In some examples, battery data processing engine 105 comprises a self-learning module.

In some examples, battery data processing engine 105 is configured to generate/revise battery operating protocols and/or battery testing protocols, as further described below with reference to FIG. 2A. For example, battery data processing engine 105 may revise a previously-used battery operating protocol based on the results of a recent leakage current testing.

In some examples, these battery operating protocols and battery testing protocols are transmitted to various power systems and used by the power systems for operating and testing batteries, e.g., determining leakage current describe below with reference to FIG. 2B.

Battery Pack Examples

Figure 1B:
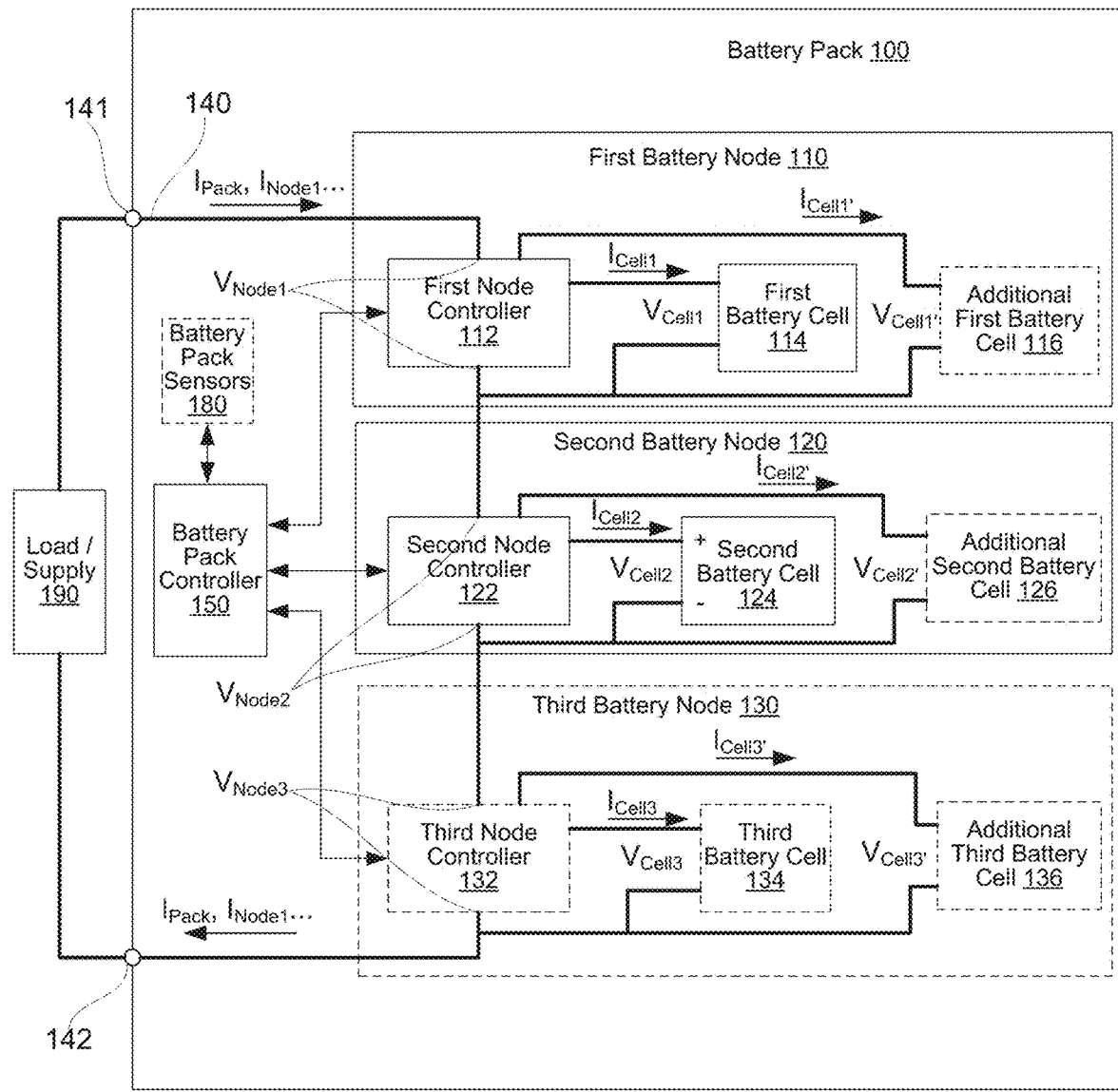
FIG. 1B is a schematic block diagram of a battery pack, comprising multiple battery nodes, interconnected in series and controlled by a battery pack controller, in accordance with some examples.

FIG. 1B is a schematic illustration of battery pack 100 configured for in-situ leakage current testing of battery cells in battery pack 100, in accordance with some examples. Battery pack 100 comprises at least two battery nodes, e.g., first battery node 110, second battery node 120, and third battery node 130. Each battery node comprises at least one cell. As such, battery pack 100 may be referred to as a multi-cell battery pack. In some examples, battery pack 100 comprises tens, hundreds, and even thousands of battery nodes. The number of nodes depends on the desired power output of battery pack 100, the power output of each battery cell, the number of cells in each node, operating characteristics of node controllers in each node, and other like factors. In the following description, references will be made primarily to first battery node 110 and second battery node 120. However, one having ordinary skill in the art would appreciate that described features apply to additional battery nodes, which are optional.

Each battery node comprises a node controller and at least one battery cell. Referring to FIG. 1I, first battery node 110 comprises first node controller 112 and first battery cell 114, connected to and controlled by first node controller 112. More specifically, first node controller 112 controls electrical connections of first battery cell 114 to the remaining components of first battery node 110. These electrical connections may be also referred to as electrical power connections to distinguish from testing connections to first node controller 112, such as voltage leads used to monitor the OCV or supplying a small current to first battery cell 114 to maintain a constant SOC during the leakage current testing. Similarly, second battery node 120 comprises second node controller 122 and second battery cell 124, connected to and controlled by second node controller 122. Finally, third battery node 130, if present, comprises third node controller 132 and third battery cell 134, connected to and controlled by third node controller 132. Second node controller 122 and third node controller 132 may be referred to as additional node controllers.

In some examples, at least one battery node comprises one or more additional batteries, which are optional. For example, FIG. 1B illustrates first battery node 110 also comprising additional first battery cell 116, independently connected to and controlled by first node controller 112. More specifically, first node controller 112 controls first battery cell 114 and additional first battery cell 116, independently from each other. In some examples, first battery node 110 comprises multiple battery cells, which are controlled together (e.g., as a unit) by first node controller 112. The cells within this unit may be interconnected in series, parallel, or various combinations of these methods. Similarly, second battery node 120 comprises additional second battery cell 126, also connected to and controlled by second node controller 122, independently from second battery cell 124. While FIG. 1B illustrates two battery cells in each of first battery node 110 and second battery node 120, each battery node can have any number of battery cells, e.g., one, two, three, four, or more. The number of battery cells per node is determined by the control capability of the node controller at this node as well as the power ratings of the power converter in the corresponding node controller. Furthermore, the number of cells in different nodes may be the same (e.g., as in FIG. 1B) or different. FIG. 1B also illustrates third battery node 130, comprising additional third battery cell 136, also connected to and controlled by third node controller 132, independently from third battery cell 134. As noted above, third battery node 130 is optional. Furthermore, if third battery node 130 is present, third battery node 130 may include any number of battery cells.

Figure 1C:
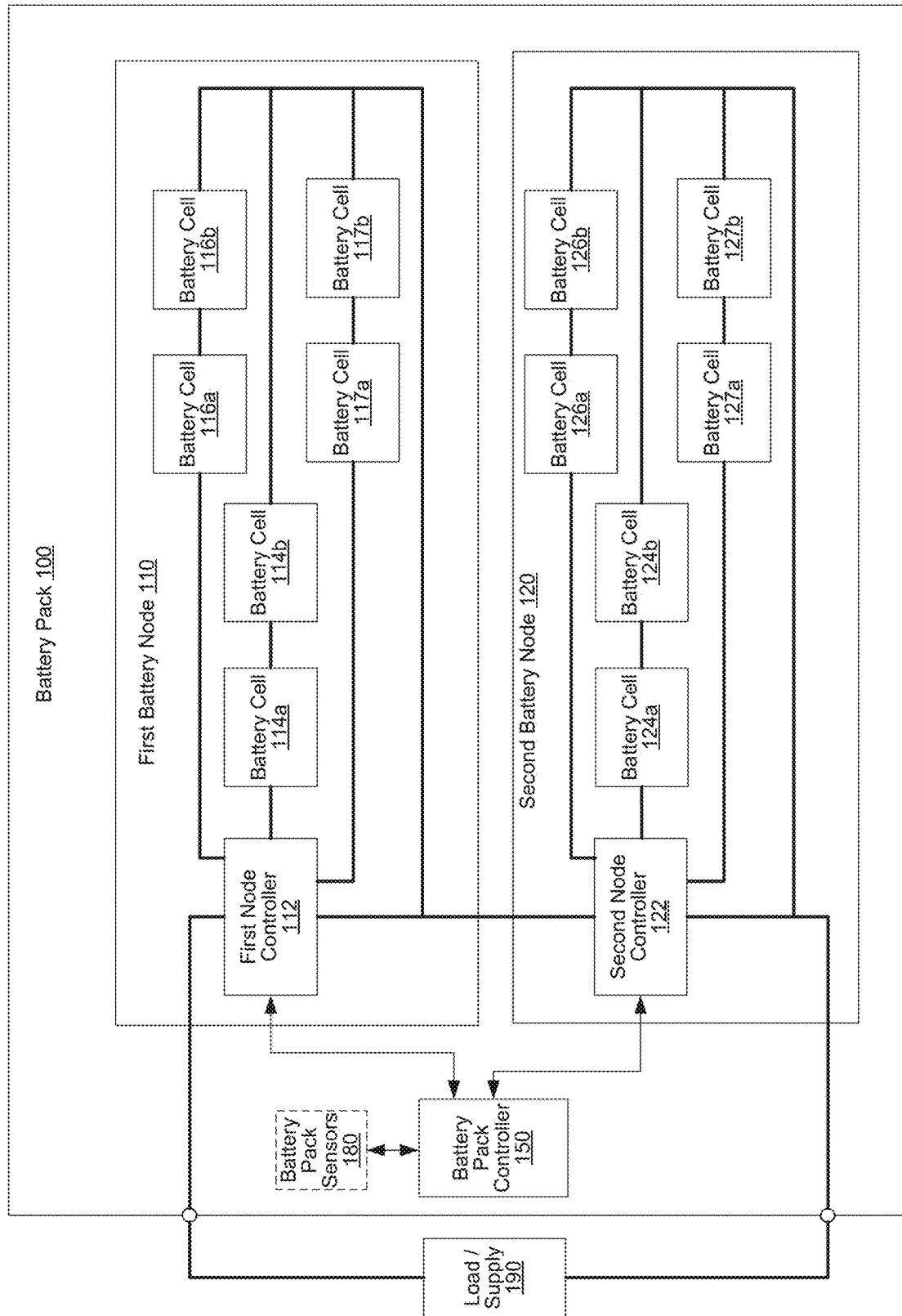
FIG. 1C is a schematic block diagram of another example of a battery pack, comprising multiple battery nodes, interconnected in series and controlled by a battery pack controller.

FIG. 1C illustrates another example of battery pack 100. In this example, each node comprises six cells, forming three sets connected in parallel to each other. Each set comprises two cells connected in series with each other within the set. Specifically, first battery node 110 comprises battery cells 114a and 114b (interconnected in series with each other, and forming a first set), battery cells 116a and 116b (interconnected in series with each other, and forming a second set), and battery cells 117a and 117b (interconnected in series with each other, and forming a third set). Each of these sets is connected in parallel to first node controller 112, which independently controls the operation of each set. Similarly, second battery node 120 comprises battery cells 124a and 124b (interconnected in series with each other, and forming a first set), battery cells 126a and 126b (interconnected in series with each other, and forming a second set), and battery cells 127a and 127b (interconnected in series with each other, and forming a third set). Each of these sets is connected in parallel to second node controller 122, which independently controls the operation of each set. This configuration may be referred to as a 3P/2S node. In this configuration, in-situ leakage current testing may be performed on each set or individual cells (e.g., using separate voltage leads, which are not shown in FIG. 1C). In general, any configuration of each battery node is within the scope. A node with multiple cells (e.g., eight cells, twelve cells) may be also referred to as a battery pack module, a battery module, a cell module assembly, or a module. The cells of each module may have various types of connections with each other and a corresponding node controller. In some examples, the entire module is taken offline for testing one or more (e.g., all) cells of this offline module. Alternatively, only a subset of cells in a module is taken offline, while remaining cells remain operational.

The battery nodes are connected in series by bus 140. In more specific examples, the node controllers of different battery nodes are connected in series by bus 140. Individual connections of one or more battery cells, within each node, are controlled by the node controller of this node. The ends of bus 140 are coupled to or form battery pack terminals, such as first battery pack terminal 141 and second battery pack terminal 142. During operation of battery pack 100, load/supply 190 is connected to the battery pack terminals to supply power to battery pack 100 and/or to receive power from battery pack 100, which is collectively referred to as power output. Overall, battery pack 100 may provide a direct current (DC) power or an alternating current (AC) power (e.g., when power converters of node controllers are also configured to invert the DC power, supplied by the battery cells, to the AC power at the battery pack terminals).

Referring to FIG. 1B, battery pack 100 also comprises battery pack controller 150, which is communicatively coupled to each node controller. Battery pack controller 150 controls operation of each node controller, which in turn controls the operation of each battery cell. For example, battery pack controller 150 instructs first node controller 112 to discontinue the electrical current through first battery cell 114, for the in-situ leakage current testing of first battery cell 114. In other words, battery pack controller 150 instructs first node controller 112 to bring first battery cell 114 offline to initiate the in-situ leakage current testing of first battery cell 114. Battery pack controller 150 also receives OCV measurements from first battery cell 114, during the in-situ leakage current testing of first battery cell 114 and while no current is flowing through first battery cell 114.

Battery pack controller 150 is also configured to maintain the power output and the overall operation of battery pack 100 such that this power output is not impacted by in-situ leakage current testing. For example, when first node controller 112 discontinues the current through first battery cell 114, battery pack controller 150 also instructs first node controller 112 and/or one or more of other node controllers to compensate for the power output changes associated with taking first battery cell 114 offline. This power compensation may be provided by a battery cell at the same node (e.g., additional first battery cell 116) and/or one or more cells at one or more other nodes (e.g., second battery cell 124). In some examples, multiple cells are used for this power compensation, even when only one battery cell is taken offline. Spreading the power compensation over multiple battery cells allows reducing the change in charge/discharge current through each cell.

In general, battery pack controller 150 is configured to select one or more cells for this power compensation, based on various factors, such as the pack current power output, expected power output, the SOC of each battery cell, power and control capabilities of a power converter in each node controller, and others. Furthermore, the initial selection of battery cells (for this power compensation) may change over time, e.g., by using additional cells for power compensation. Additional features of battery pack controller 150 are described below with reference to FIG. 1E. Battery pack controller 150 should be distinguished from node controllers, which provide a node-level control. Battery pack controller 150 provides a pack-level control, e.g., synchronizing operations of different node controllers.

Referring to FIG. 1B, in some examples, battery pack 100 also comprises battery pack sensors 180, communicatively coupled to battery pack controller 150. Some examples of battery pack sensors 180 include but are not limited to one or more thermocouples (e.g., thermally coupled to individual battery cells), Hall effect sensors, voltage probes (e.g., electrically coupled to terminals of each battery cell), current shunts, ultrasound sensors, pressure sensors, magnetic sensors, piezo sensors, gas sensors, and others. In some examples, the output of the sensors may be used to trigger in-situ leakage current testing (e.g., when a battery is at a particular voltage and/or temperature). Furthermore, the output of the sensors (e.g., voltage probes) may be used to collect the OCV data during in-situ leakage current testing and/or supplement the OCV data. For example, the temperature data obtained by a thermocouple may be correlated with the OCV data (and, optionally, with other battery data), e.g., for the local analysis by battery pack controller 150 and/or for the global analysis by battery data system 102. In some examples, the process involves developing a weighted temperature cost function that when combined with time and OCV readings, allows a more precise correlation of OCV changes/leakage current (relative to an example not accounting for temperature).

The architecture of battery pack 100, described above and schematically shown in FIG. 1B, enables various functions and other features, which are not available in conventional battery packs (with direct in series and/or parallel connections among battery cells). As noted above, this architecture allows in-situ leakage current testing of individual battery cells, while battery pack 100 remains operational. This testing is performed without any impact to the overall pack power output. Furthermore, this architecture allows interconnecting in series a large number of battery nodes, without individual cells' performances compromising the performance of the overall pack. The performance of each cell is maximized by periodic and individual testing of each cell, e.g., for leakage current. The test results are used, for example, to uniquely operate each cell.

A brief description of node controllers, used in battery pack 100, is presented herein to provide additional detail of the individual cell control. In some examples, a node controller comprises a power converter, which provides DC-DC conversion and/or DC-AC conversion functionality for each cell connected to the power converter. For example, the power converter may be configured to step-up or step-down the voltage of first battery cell. The node controller is configured to take offline and bring online each battery cell in this node, e.g., either individually or as a set (e.g., when multiple cells in the same node are connected in series). A node controller also determines, based on the input from the battery pack controller 150, the contribution level of the cell current to the node current. This contribution is controlled using, e.g., the duty cycle of the power converter in the node controller, which provides a voltage conversion from the cell level to the node level.

Due to the in-series connections of the nodes, the current flowing through each node is the same ($I_{BUS}=I_{NODE1}=I_{NODE2}=\ldots$). The bus voltage is the sum of all node voltages ($V_{BUS}=V_{NODE1}+V_{NODE2}+\ldots$). However, the cells are functionally isolated from bus 140 by their respective node controllers. The architecture of the battery pack shown in FIG. 1B allows the cell voltage and the cell current to be different from the corresponding node voltage and the node current. As noted above, this difference is determined by the duty cycle of the power converter. Assuming negligible power losses at the node controllers, the combined power output of all cells in the node (e.g., $P_{CELL}=V_{CELL}\times I_{CELL}+V_{CELL}\times I_{CELL}$ for the two-cell example) is the same as the power output of the node ($P_{NODE}=V_{NODE}\times I_{NODE}$). In other words, the relationship between the cell voltage and the cell current as well the node voltage and the node current are as follows: $V_{CELL}\times I_{CELL}+V_{CELL}\times I_{CELL}=V_{NODE}\times I_{NODE}$. When a node has only one cell, this equation reduces to $V_{CELL}\times I_{CELL}=V_{NODE}\times I_{NODE}$.

The node current is determined by the overall power output of battery pack 100, e.g., determined by load/supply 190 connected to battery pack 100. When no electrical current is flowing through the cell ($I_{CELL}=0$) and there are no other cells in this node, the voltage across the node is also zero ($V_{NODE}=0$). With additional cells at the node, the voltage across the node may be maintained, fully or partially, by these other cells.

Continuing with the single cell per node example, in some examples, the entire node current is flowing through the cell ($I_{CELL}=I_{NODE}$). In these examples, the voltage across the cell is the same as the voltage across the node ($V_{CELL}=V_{NODE}$), and the node controller is operable s a simple connector between the cell and bus 140. In other examples, the cell voltage is different from the node voltage (e.g., $V_{CELL}<V_{NODE}$ for a step-up conversion or $V_{CELL}>V_{NODE}$ for a step-down conversion).

Continuing with the single-cell per node example, when a cell is taken offline and no electrical current is flowing through this cell ($I_{CELL}=0$), e.g., for in-situ leakage current testing, one or more other nodes compensate for any power changes associated with this offline switch. This may be referred to as global power loss compensation or external power loss compensation across multiple nodes in battery pack 100.

With multiple cells present at the same node, the node controller independently controls each cell or a set of the cells (e.g., when multiple cells in the same nodes are connected in series). The combined power output of multiple cells is the same as the power output of the node ($P_{NODE}=P_{CELL1}+P_{CELL2}+\ldots$). The relationship between the cell voltages and the cell currents as well the node voltage and the node current are more complicated than, e.g., in the previous example with a single cell per node. With multiple cells, this relationship takes the following form: $V_{NODE}\times I_{NODE}=V_{CELL1}\times I_{CELL1}+V_{CELL2}\times I_{CELL2}+\ldots$.

In this example with multiple cells per node, when one cell is taken offline and no electrical current is flowing through this cell ($I_{CELL}=0$), one or more other cells at this node may entirely compensate for any power changes associated with taking the first cell offline. This may be referred to as a local power loss compensation. Alternatively, one or more other nodes compensate for any power changes associated with taking the first cell offline, even for the multiple cells per node example. Finally, the power compensation may come from both within the same node (e.g., other cells) and one or more other nodes, which may be referred to as hybrid power loss compensation.

Figure 1D:
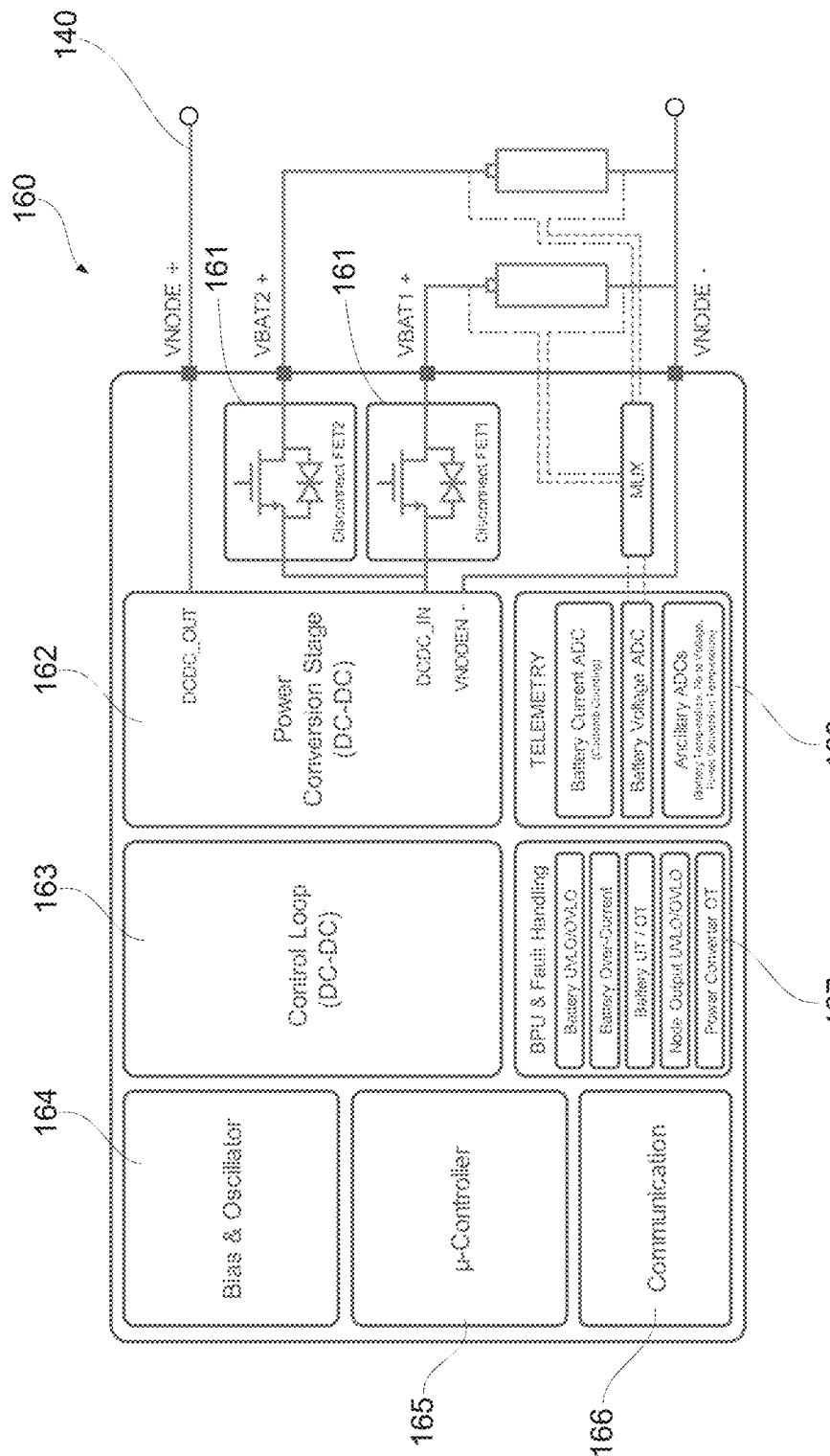
FIG. 1D is a schematic block diagram of a node controller, used in each node of a battery pack, in accordance with some examples.

FIG. 1D is a schematic illustration of node controller 160 used for controlling a single battery cell, in accordance with some examples. Node controller 160 represents any one of power converters shown in FIG. 1B. Node controller 160 comprises one or more switches 161, which may be a field-effect transistor (FET) switch as, for example, is shown in FIG. 1D. Each switch is configured to connect and disconnect a corresponding battery cell from bus 140. It should be noted that the battery cells and bus are shown in FIG. 1D for context and these components are not parts of node controller 160. In some examples, one or more switches are configured to bypass an electrical current through the first battery node 110.

In some examples, node controller 160 comprises bias and oscillator module 164. The bias part of this module sets the internal fixed voltage and current levels for other parts of node controller 160 (e.g., for controlling switches 161). The oscillator part provides a configurable clock signal for other parts of node controller 160, such as communication, FET switching, and analog-to-digital converters (ADCs). In some examples, node controller 160 comprises µ-Controller 165, which coordinates various node operations. Specifically, µ-Controller 165 is configured to execute the embedded control logic (e.g., software, firmware). In some examples, node controller 160 comprises communication module 166, which handles communication with other nodes and battery pack controller 150. In some examples, node controller 160 comprises control loop 163, which is configured to adjust switching characteristics of power conversion stage 162, e.g., to regulate the desired node output voltage and power. A combination of power conversion stage 162 and control loop 163 may be referred to as a power converter.

In some examples, node controller 160 comprises battery protection unit (BPU) and fault handling module 167. BPU and fault handling module 167 is configured to monitor the battery voltage and voltage conversion levels as well as corresponding currents. In some examples, BPU and fault handling module 167 is also configured to monitor temperatures of various components of node controller 160 and battery cells. Monitoring various other abnormal states of node controller 160 is also within the scope. In some examples, BPU and fault handling module 167 is configured to trigger various corrective actions (e.g., trigger a bypass). In some examples, node controller 160 comprises power conversion stage 162, which steps up or down the voltage level from the cell-side to the bus-side. In some examples, node controller 160 comprises telemetry module 168, which is configured to process various measurements (e.g., ADCs, voltage, current, temperature). Telemetry module 168 may also report the measurements to control loop 163, BPU and fault handling module 167, and external devices (e.g., battery pack controller 150) using communication module 166. In some examples, the quiescent operating current of node controller 160 is at least 10 times, 100 times, or even 1,000 times lower than a typical leakage current of battery cells. This much lower leakage current is achieved by using ADCs with large input impedance and/or by sampling the voltage infrequently (e.g., a 1-second measurement every hour). For example, a self-discharge of 1% SOC per month for 100 Ah cell corresponds to a leakage current of about 1.4 mA. In this example, the ADC bias is about 10 µA to 100 µA or 40 kΩ to 400 kΩ impedance to achieve the 10-100× factor.

Figure 1E:
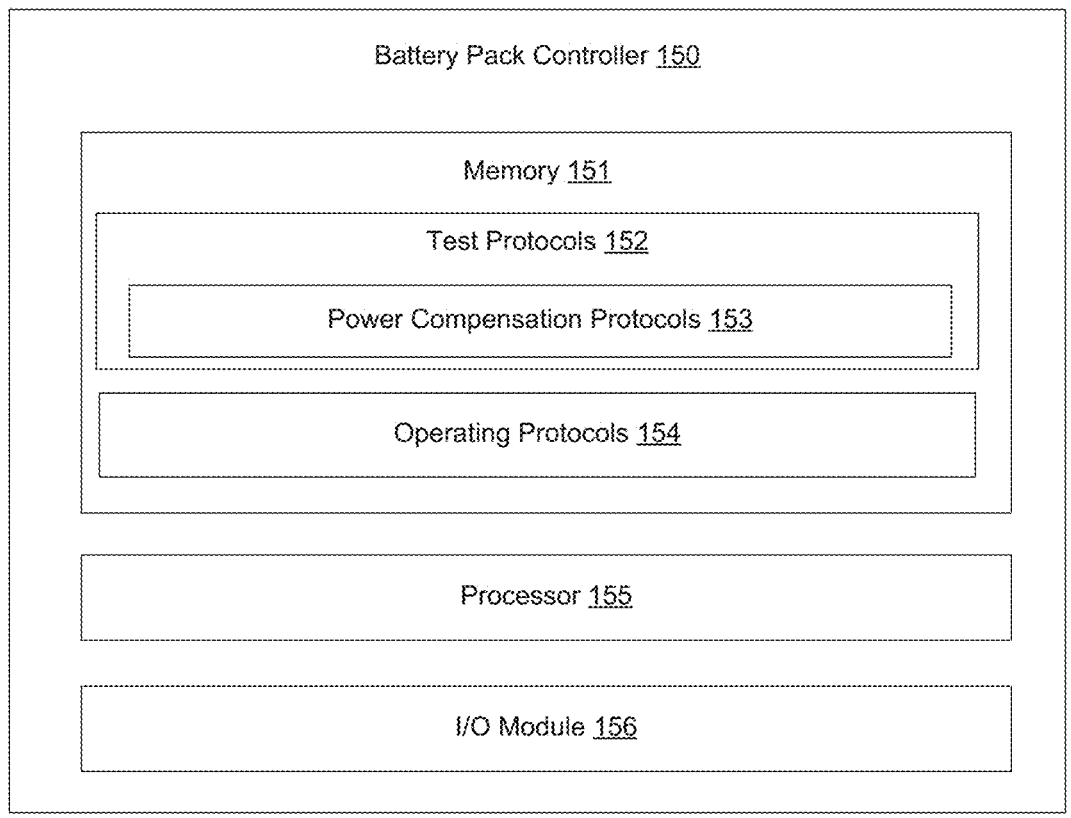
FIG. 1E is a schematic block diagram of a battery pack controller, showing various components and features, used by the battery pack controller to control operations of each node in a battery pack, in accordance with some examples.

FIG. 1E is a schematic illustration of battery pack controller 150, in accordance with some examples. Battery pack controller 150 comprises memory 151, configured to store various criteria for initiating in-situ leakage current testing, test protocols 152 (e.g., starting SOC, duration, desired precision), power compensation protocols 153, operating protocols 154, and test results. Some examples of these criteria include, but are not limited to, duration since the last test, exceeding certain threshold parameters (e.g., thresholds for charge/discharge currents, upper/lower temperatures) during cell operation, and others. Other examples are described below.

Battery pack controller 150 also comprises processor 155, which is configured to initiate in-situ leakage current testing. Processor 155 is also configured to determine leakage current, e.g., based on multiple OCV data points over time, which may be referred to as an OCV profile or an OCV function, e.g., OCV(t). For example, battery pack controller 150 is configured to obtain two or more OCV values from first battery cell 114 while the external cell current is discontinued through first battery cell 114 thereby determining the leakage current of first battery cell 114.

For example, processor 155 may utilize a lookup table in memory 151 to correlate OCV values with SOC values and then determine the leakage current based on the states of SOC values over time. As noted above, a loss of 1% SOC per month for 100 Ah cell corresponds to a virtual constant leakage current of about 1.4 mA. In some examples, processor 155 is also configured to determine an operating mode for a battery cell, e.g., based on the leakage current results. For example, processor 155 may instruct a corresponding node controller to disconnect the cell (e.g., after a slow discharge at less than 0.1 C) if the leakage current result exceeds a certain threshold (e.g., a safety threshold). Various other functions of processor 155 are described below with reference to various operations of the method in FIG. 2B.

In some examples, battery pack controller 150 comprises input/output (I/O) module 156 to communicate with each node controller in battery pack 100, battery pack sensors 180, and/or external systems (external to battery pack 100). For example, battery pack 100 may be a part of a larger system, such as an electric vehicle, grid-attached or off-grid energy storage system, and others as described above with reference to FIG. 1A. In the examples, I/O module 156 is configured to communicate with a battery data system, described above, to deliver test data, retrieve test protocols, and/or obtain new operating protocols.

In some examples, battery pack controller 150 is configured to proportionately or disproportionately distribute the pack power output among different nodes. This power distribution may be based on state of health and/or state of safety parameters from this system, model parameters learned from other systems, and other parameters. Furthermore, in some examples, battery pack controller 150 is configured to perform hazardous failure detection. For example, a high leakage current may be an indication of internal shorts. Some causes of internal shorts include, but are not limited to, (a) unintended conductive particles that penetrate the separator and short the positive and negative electrodes and (b) growth of metallic dendrites (e.g. lithium, copper) from the negative electrode piercing through the separator. High leakage current may be also an indication of the plating of metallic lithium on the surface of the negative electrode that causes an increase in the rate of electrolyte reduction. In some examples, a high leakage current may be an indication of an overcharge condition that causes an increase of the rate of electrolyte oxidation at the surface of the positive electrode and/or over-temperature conditions that cause an increase of the rates of electrolyte oxidation at the surface of the positive electrode and electrolyte reduction at the negative electrode. This higher-rate electrolyte oxidation is partly due to the Arrhenius law governing chemical reactions and partly due to the decomposition of the pre-existing passivation layers at certain elevated temperatures. Some other examples of hazardous conditions, which may be evident based on an increase of leakage current include, but are not limited to, physical damage to the cell (e.g., puncture, crushing) and external shorts, due to the presence of foreign conductive matter between the external tabs of the cells or anywhere along the electrical network connected to the cell. Some examples of determining hazardous conditions and corresponding degradation mode determination protocols are described below with reference to FIGS. 5A-7B. For example, severe shorts can be directly evident from a significant increase in the leakage current of the cell, relative to other cells. These shorts can generally be determined at any SOC. Other degradation mechanisms may be less evident. For example, machine learning algorithms may be used, e.g., trained on fleet-wide cell leakage data to determine various types of degradation mechanisms.

In some examples, battery pack controller 150 is configured to perform cell degradation analysis. This analysis may involve an estimate of the leakage current (or a rate of self-discharge) by monitoring the evolution of the cell voltage under open-circuit conditions over a period of time. Estimates of leakage current exceeding a preset threshold or qualifying as an outlier (e.g., based on the histogram of comparable cells) provide various indications of cell degradation.

Examples of Global Data Analysis

Figure 2A:
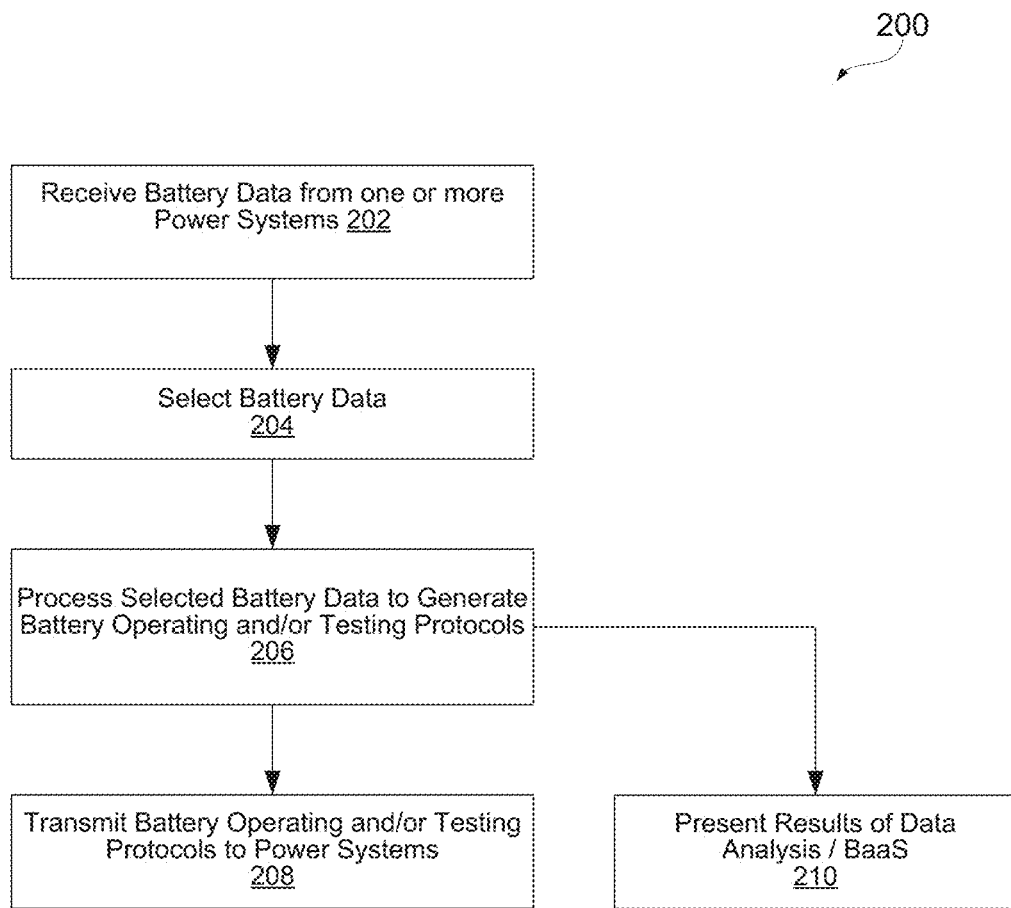
FIG. 2A is a process flowchart corresponding to a method for collecting and analyzing battery data from multiple power systems and developing new battery operating procedures and/or new battery testing protocols for these power systems, in accordance with some examples.

FIG. 2A is a process flowchart corresponding to method 200, representing various examples of global battery data analysis. This global battery data analysis may be performed by battery data system 102 or, more specifically, by battery data processing engine 105, various examples of which are described above with reference to FIG. 1A. The global battery data analysis is performed, for example, in addition to or instead of a local battery data analysis at a battery pack level (e.g., performed by a battery pack controller). In some examples, the results of battery pack controller analysis (e.g., the leakage current is determined using a battery pack controller based on OCV changes over time) are supplied to battery data system 102 as battery data for further processing.

In some examples, method 200 comprises receiving (block 202) battery data from one or more power systems. Some examples of the battery data include, but are not limited to, leakage current, temperature, operating parameters and history (e.g., several charge-discharge cycles, cut off voltages, SOCs, and charge/discharge rates) and others. The battery data corresponds to specific battery nodes (e.g., based on the identification of each node) and, in some examples, is separated into sets (e.g., each set corresponding to one node). For example, each node may have unique identification in battery ecosystem 103. The battery data may be encrypted, compressed, and/or other preprocessed (e.g., identifying various degradation mechanisms) before transmitting from the power systems to battery data system 102. For example, the received battery data comprises various determinations made at the battery pack level, such as state of health, state of power, and/or state of safety. This battery data may represent different power systems, different battery packs, and different battery cells. In some examples, the battery data may represent the same type of cells (e.g., cells having the same design) or different types of cells. The selection of different data sets, representing different battery nodes, (e.g., for aggregate analysis, benchmarking, and/or comparison) and/or data sets, representing the same battery node but at different test times, is performed at battery data system 102. For example, leakage current data from a set of different size cells may be compared to determine the effect of the cell size on self-discharge characteristics. In some examples, battery manufacturers produce multiple cell designs (e.g., an 11-Ah cell and a 55-Ah cell) using the same type of cell components (e.g., electrodes, electrolytes). The knowledge derived from one cell type may be relevant to another cell type. In some examples, battery data is received as a continuous stream of semi-structured data.

In some examples, power system 101 is configured for wired/wireless transfer (e.g., secure communication channels) of battery data to a battery data system. Power system 101 or, more specifically, each battery node may have a unique identifier (UID), which may be a vehicle identification number for electrical vehicles (EVs). Furthermore, power system 101 may include an application programming interface (API) key for identity authentication. When power system 101 is connected to battery data system 102, power system 101 uploads structured data (e.g., adhering to a schema, such as tabulated or SQL database) or unstructured data (e.g., records pairs). In some examples, battery data is aggregated into an array form. More specifically, the data may be aggregated based on a node id and/or sorted by chronological order. In some examples, a subset of the most recent data (e.g., last week, last month) is selected for trend analysis. The battery data is stored in battery data store 104, which may be a database, specifically configured for the battery data.

In some examples, method 200 comprises selecting (block 204) the battery data received from different power systems, e.g., based on the cell type, temperature, age, SOC, battery application (e.g., grid, residential, EV), and other like parameters. For example, battery data from different nodes or even different power systems may be used to compensate for differences among cells and provide for meaningful comparison. This operation may involve various data sorting algorithms.

In some examples, method 200 comprises processing (block 206) the selected battery data to determine degradation mechanisms and/or generate battery operating protocols, future battery testing protocols, and other like protocols. Determining degradation mechanisms based on leakage current data is described elsewhere in this document. Global battery data helps with finding data trends and/or applying various predictive models to anticipate degradation before any corresponding failures occur and to utilize various preemptive measures to avoid these failures and/or degradation. For example, a cell with an increased leakage current may be switched to an operating protocol with cell-preserving operating parameters (e.g., smaller charge/discharge currents, different cut off voltages, and others).

In some examples, self-learning methodologies (e.g., machine-learning, deep-learning, or even multi-modal machine-learning) are applied to process the data and, more specifically, to develop new battery testing protocols and/or to revise previous test protocols. For example, initial leakage current data may be used to identify an initial degradation mechanism, which is verified using a revised test. One example of this feedback-loop testing is adaptive charging, where leakage current data is collected at different charging schema (e.g., fast charging of 10 C vs. normal charging of 1 C).

In some examples, processing the selected battery data involves an outlier detection scheme. One specific example involves a numeric outlier technique, e.g., a numeric value beyond Q3+k*IQR, where "IQR" represents the interquartile range, "Q3" represents the third quartile, and "k" represents interquartile multiplier value. Another example of outlier detection is a Z-score technique, which assumes a Gaussian distribution of the battery data with the outliers positioned in the tails of the distribution. For example, the distribution of leakage currents may be used, as measured within a battery pack, a subset of a battery pack, a power system, or multiple power systems.

In some examples, data processing involves one or more of business intelligence dashboards (e.g., corresponding to product usage trends and patterns), operational monitoring (e.g., identifying cell degradation mechanisms), anomaly detection (e.g., variations in battery data), embedded analytics (e.g., providing operators of power systems various access to data and reports), and data science (e.g., advanced analytics and machine learning for predictive testing and maintenance of battery packs, development of new test and operating protocols, artificial intelligence (AI) development).

In some examples, method 200 comprises transmitting (block 208) the battery operating protocols and/or battery testing protocols to different power systems. The selection of power systems (for new protocol) may be based on information available to battery data system 102 about these power systems. Some examples of this information include, but are not limited to, types of cells, sizes and/or architectures of battery packs, previous test data, and others.

For example, the operation of multiple EVs generates data for each cell in these EVs. For context, a typical 10-100 kWh battery pack used for EVs may include hundreds or even thousands of individual cells. Many EVs are operated using different operating parameters (e.g., charge/discharge rates, SOCs, temperatures). As such, individual cell data from multiple EVs frequently collected over long periods (e.g., EV operating lifetime) can be easily characterized as "big data" or, more specifically, "big battery cell data." Raw data corresponding to individual cells for multiple EVs is aggregated and processed by battery data system 102, which may be also referred to as a "cloud". This data is processed to evaluate degradation mechanisms and, in some examples, combined with user profiles (e.g., vehicle identification numbers, owners of EVs). Based on these determined degradation mechanisms, battery management settings are determined for each use profile of battery pack 100. Some examples of the raw data include, but are not limited to, leakage currents, exposed temperatures, temperature responses to power take in or take out, SOCs, charge/discharge rates, impedance, resistances, capacitances, magnetic fields distribution, and time. In some examples, leakage currents are presented as a function of temperature, SOC, and time as well as degradation mechanisms when preprocessed at the system level. For example, during this data analysis, lithium plating is detected for a certain user profile associated with a high performance (e.g., high charge/discharge currents) but a smaller used range defined by the SOC. Based on this degradation mechanism, battery pack 100 is instructed to use lower cut off voltages for the suspect batteries, to operate in low impedance regimes, and/or to manage the cutoff voltages based on the cell temperature (e.g., reduce an upper cut off voltages at low temperatures to mitigate further lithium plating).

Furthermore, individual cell data (from multiple EVs) provides higher statistical accuracy than, for example, data available at the EV level or just a few test cells. In some examples, this big battery cell data is used to generate more precise maintenance requirements or lifetime predictions of the individual EVs, battery packs, and even individual cells. Self-learning cloud-based processing is used, for example, to improve individual battery pack management. In some examples, this battery pack is customized for each user and may involve independent management of each cell in a battery pack. Furthermore, this big battery cell data may be used to improve the manufacturing of battery cells and/or battery packs. For example, a first cell generation is used in an EV fleet, for which the big battery cell data is collected. Based on the global analysis of this data, a second cell generation is developed. Additional developments of battery cycles with these feedback loops are within the scope.

In some examples, cell data collected from a fleet of EVs (e.g., corresponding to a specific make-model) allows for faster data processing and real-time battery management of these EVs. For example, cell data may be used for a prediction of range, charge requirement for the next trip (e.g., full charging, partial charging, charging in a certain cut off voltage range), and power requirements, all of which may be more precise than currently available. For example, an upcoming trip is short but requires lots of power (e.g., driving up a steep hill or at highway speeds). In this example, the battery pack of this particular EV is charged to a certain SOC while the power and efficiency are optimized during the utilization of this power. In another example, a degradation mechanism, identified in one or more EVs, is used to update operating parameters of battery packs of the entire EV fleet.

In some examples, individual cell data is collected from multiple stationary storage systems. This cell data is processed in the cloud to determine various degradation mechanisms. Based on these degradation mechanisms, battery management is updated. For example, a specific system is used to achieve high power peaks without requiring a large storage capacity. If a lithium plating is detected in this system (e.g., based on an increase of leakage currents), the operating mode of this system may be updated to use lower cut off voltages (than before). Furthermore, the system may be operated in low impedance regimes. In some examples, the cut off voltage used for the operation of this system may be temperature-dependent (e.g., reducing upper cut off voltages at lower temperatures to mitigate further lithium plating).

In some examples, a stationary battery system is used for power storage from a solar array or a wind farm. In these examples, the analysis of individual cell data is combined with the weather forecast (e.g., sunlight intensity and duration, wind speed), charge requirement to satisfy energy profile for an upcoming next period (e.g., full charging, partial charging, charging in a certain cut off voltage range), and/or power requirement.

In some examples, method 200 involves presenting results of the data analysis (block 210) to one or more users in battery ecosystem 103. These users may be power system manufacturers, power system owners, and/or third parties (e.g., researchers). For example, battery data system 102 may provide a user interface for controllably accessing, retrieving, managing, and/or analyzing the battery data. In some examples, battery data system 102 is configured to manage the battery data ownership and/or data accessibility.

Examples of In-Situ Leakage Current Testing

Figure 2B:
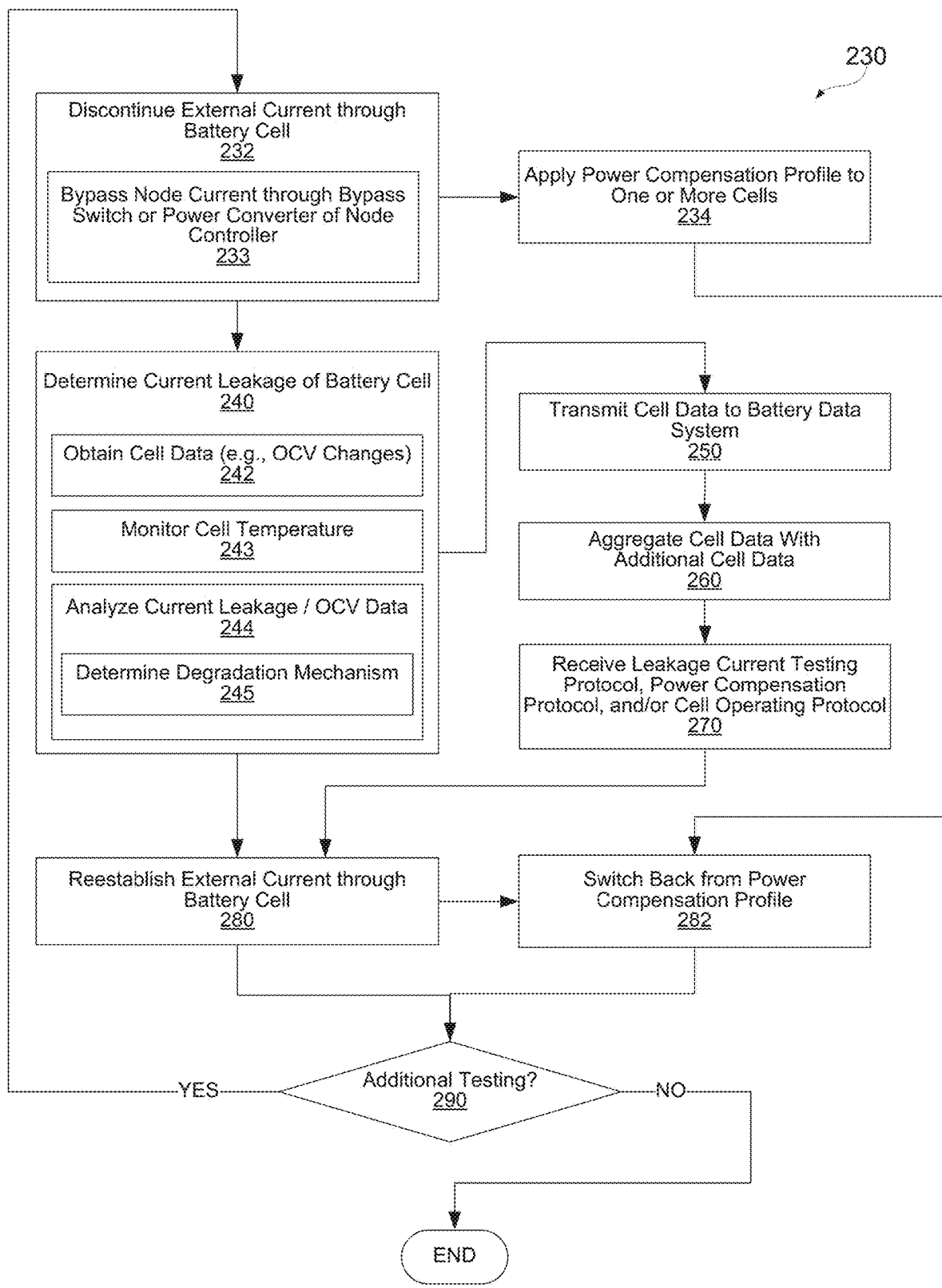
FIG. 2B is a process flowchart corresponding to a method for an in-situ leakage current testing of battery cells in a battery pack, in accordance with some examples.

FIG. 2B is a process flowchart corresponding to method 230 for in-situ leakage current testing of battery cells in battery pack 100, in accordance with some examples. Various details and examples of battery pack 100 are described above with reference to FIGS. 1B-1E.

In some examples, method 230 comprises discontinuing (block 232) the external current through at least first battery cell 114. The external current may be also referred to as a current cell ($I_{Cell1}=0$) and should be distinguished from the node current and the leakage current. In other words, first battery cell 114 is taken offline and no longer contributes to the power output of battery pack 100. In more specific examples, multiple battery cells are taken offline at the same time for simultaneous leakage current testing. For example, FIG. 1C illustrates two battery cells connected in series (battery cell 114*a* and battery cell 114*b*) and disconnecting the external current through one of these cells will also cause the same disconnecting the external current through the other cell. Overall, multiple battery cells, which are simultaneously taken offline, may be a part of the same node and/or different nodes. The number of battery cells, which can be simultaneously taken offline, depends on the current power output of battery pack 100, SOC of the cells, and other like factors.

The operation represented by block 232 is performed while battery pack 100 remains operational and, in more specific examples, while battery pack 100 provides power output (such being discharged or charged). In other words, battery pack 100 remains online, while first battery cell 114 is taken offline. Specifically, at least one other battery cell of battery pack 100 continues to charge or discharge, contributing to the power output of battery pack 100 while first battery cell 114 remains offline.

In some examples, the external current through first battery cell 114 is discontinued using first node controller 112, e.g., one or more switched of first node controller 112. More specifically, first node controller 112 performs this operation based on instructions received from battery pack controller 150.

In some examples, first node controller 112 may comprise a bypass switch (e.g., as a standalone component or as a part of a power converter). In these examples, discontinuing (block 232) the external cell current through first battery cell 114 comprising bypassing (block 233) a node current through a bypass switch or a power converter of first node controller 112 as further described below with reference to FIGS. 2C-2E.

Some examples of the trigger for this operation (represented by block 232) include, but are not limited to, an age/calendar time (e.g., time since cells have been manufactured), cycle count, and previous operating parameters and history (e.g., exposure to a high/low temperature, subjecting to a charge/discharge current) of either first battery cell 114 and/or of battery pack 100. For example, a battery cell may be brought offline and tested weekly and/or after every 50-100 cycles (since the last test). In the same or other examples, another trigger is on the SOC of first battery cell 114, e.g., the SOC of at least 70%, at least 80%, at least 90%, or even at least 95%. A particular SOC threshold or range is used, for example, to detect a specific degradation mechanism, to have some charge available when the state is brought back online, and other reasons. For example, the leakage current may be more evident at a higher SOC. Overall, discontinuing the external cell current through first battery cell 114 is performed when the SOC of first battery cell 114 is within a predetermined range, various examples of which listed above. Various methods of measuring or estimating the SOC of first battery cell 114 are within the scope, e.g., based on a measured voltage (e.g., an OCV or under a given load) of first battery cell 114.

In some examples, the cell temperature may be used as a condition and/or as a trigger. For example, leakage current testing is initiated when the cell reaches a certain temperature, which may be referred to as a test temperature. As described below, the temperature is a major factor affecting leakage current in battery cells. Therefore, a specific test temperature may be needed to ensure meaningful leakage-current data. It should be noted that once the cell is taken offline, the test temperature depends on the temperature of surrounding components (e.g., other cells, a thermal management system of battery pack 100, and the ambient environment) and the heat transfer between the cell and these surrounding components. In some examples, the temperature of these surrounding components may be controlled and/or predicted (e.g., from historical data). In some examples, an elevated (e.g., greater than 40° C.) temperature is used for faster testing. Furthermore, at elevated temperatures, the surrounding cells will have a higher power output capability for power balancing and, potentially, enabling testing more cells at the same time.

Some illustrative examples include, but are not limited to: (a) after a brief or prolonged exposure to a high ambient temperature (e.g. >50° C.) or a high internal cell temperature (high current), leakage current testing is scheduled to detect damaged passivation layers; (b) after a charging event under low-temperature conditions (e.g. <10° C.), leakage current testing is scheduled to detect lithium plating; (c) after a change in other measurable battery parameters (e.g., impedance, pressure) obtained by other monitoring techniques, leakage current testing is scheduled to detect physical damage (e.g. crushing) or electrical fault.

In some examples, the operation represented by block 232 is initiated based on input received by battery pack 100 from battery data system 102, communicatively coupled to battery pack 100. For example, battery data system 102 provides a trigger point and/or a battery test protocol to battery pack 100 or, more specifically, to battery pack controller 150, which initiates method 230 based on this battery test protocol. This trigger may be generated based on battery data obtain from other battery cells, e.g., which are similar to the tested battery cell of battery pack 100.

Overall, a starting time for discontinuing the external cell current through first battery cell 114 may be determined based on at least one of the operating history of first battery cell 114, the operating history of battery pack 100, the testing history of first battery cell 114, the testing history of battery pack 100, the SOC of first battery cell 114, the SOC of the battery pack (100), the temperature of first battery cell 114, the OCV of first battery cell 114, the voltage of first battery cell 114 under a given load, and/or a test data analysis of battery cells equivalent to the first battery cell 114. For example, the test data analysis or, more specifically, a test protocol, developed based on this test data analysis may be received by battery pack 100 from battery data system 102. Battery pack controller 150 then uses this test data analysis/test protocol to trigger the leakage current testing of first battery cell 114 and/or other cells of battery pack 100.

Figure 2D:
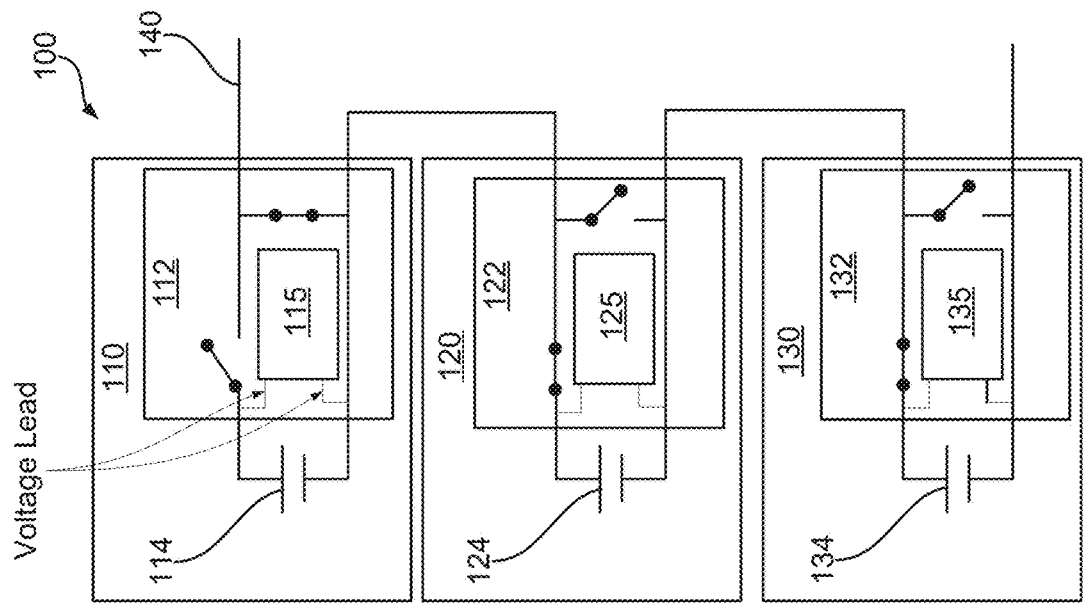
FIGS. 2C-2E are schematic block diagrams illustrating different examples of a battery pack while testing a first battery cell for leakage current.
Figure 2C:
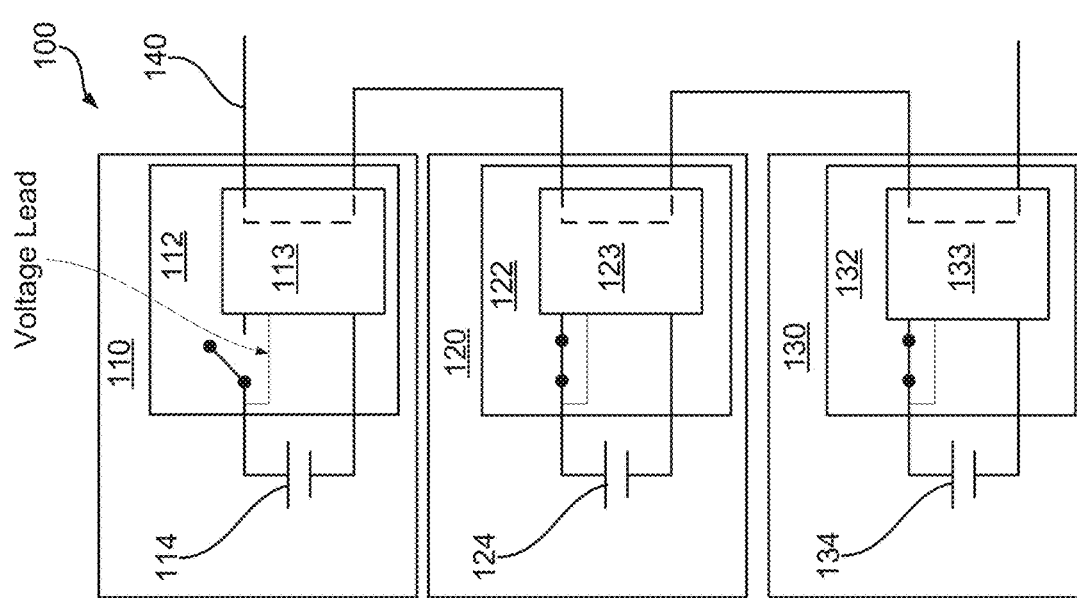
Figure 2E:
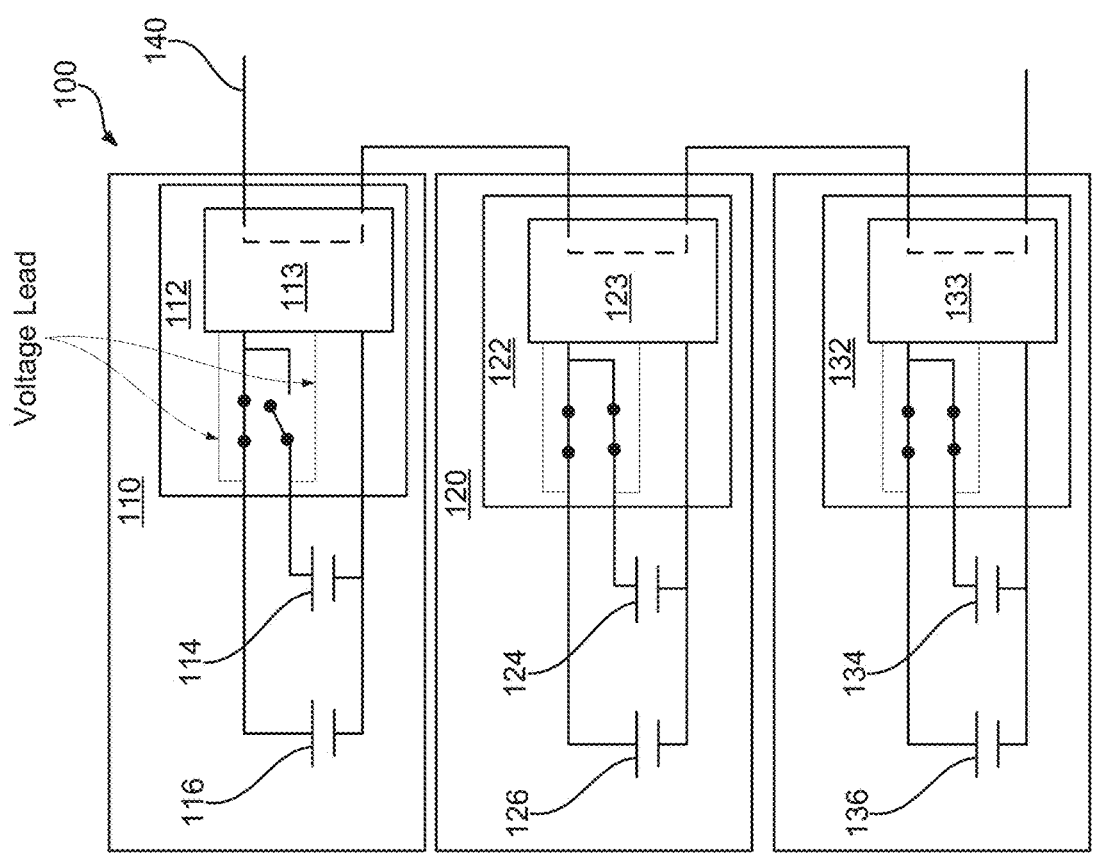

FIGS. 2C-2E are schematic block diagrams illustrating different examples of battery pack 100, while testing first battery cell 114 for leakage current. Specifically, FIG. 2C and FIG. 2D illustrate examples where each node controller comprises a power converter, selectively connected to each cell of that node and also to bus 140. In FIG. 2C, each node has only one cell, e.g., first battery node 110 comprises first battery cell 114, second battery node 120 comprises second battery cell 124, third battery node 130 comprises third battery cell 134. When the external cell is disconnected through first battery cell 114, e.g., using a switch of first node controller 112, the bus/pack current passes through first power converter 113 of first node controller 112. First power converter 113 or other components of first node controller 112 can measure voltage of first battery cell 114 through voltage leads. In some examples, these voltage leads may be used to pass a test current to first battery cell 114 (e.g., to maintain first battery cell 114 at the constant SOC while measuring the leakage current, corresponding to the test current). Continuing with the example in FIG. 2C, the power connection is retained between second battery cell 124 and second power converter 123 as well as between third battery cell 134 and third power converter 133. In other words, the external current through second battery cell 124 and through third battery cell 134 may be different than the bus current, due to step-up or step-down conversion provided by each of second power converter 123 and third power converter 133. Furthermore, one or both of second battery cell 124 and through third battery cell 134 may be used for power compensation when first battery cell 114 is taken offline for leakage testing.

Referring to FIG. 2D, each node also has only one cell, but the nodes do not have power converters. Instead, each node has a voltmeter, such as first voltmeter 115 of first node controller 112, second voltmeter 125 of second node controller 122, and third voltmeter 135 of third battery node controller 132. First voltmeter 115 is coupled (e.g., by voltage leads) to first battery cell 114 and can measure the voltage across first battery cell 114 regardless of the connection of first battery cell 114 to bus 140. For example, FIG. 2D illustrates a state of battery pack 100, in which first battery cell 114 is disconnected from bus 140. The bus current still passes through first battery node 110 and first node controller 112 using, e.g., a bypass switch. It should be noted that battery pack 100 remains operational when first battery cell 114 is disconnected from bus 140 and the bus current is bypassed through first node controller 112. The voltage across the three nodes may decrease, but an external battery inverter may provide compensation for this decrease. In second battery node 120 and third battery node 130, the bypass switch is open while each of second battery cell 124 and third battery cell 134 is connected to bus 140 and the external/bus current passes through these cells.

Referring to FIG. 2E, each node has two cells, similar to FIG. 1B described above. For example, first battery node 110 comprises first battery cell 114 and additional first battery cell 116, each independently connectable to first power converter 113 of first node controller 112. Specifically, FIG. 2E illustrates first battery cell 114 not having a power connection to first power converter 113 (the corresponding switch is open). However, first power converter 113 or some other component of first node controller 112 is configured to monitor the voltage across first battery cell 114 even in this disconnected state. Additional first battery cell 116 has a power connection to first power converter 113 (the corresponding switch is closed), and the external current passes through additional first battery cell 116. Both of second battery cell 124 and additional second battery cell 126 of second battery node 120 have power connections to second power converter 123 of second node controller 122. As such, external currents pass through second battery cell 124 and additional second battery cell 126, which may be the same or different. Similarly, both of third battery cell 134 and additional third battery cell 136 of third battery node 130 have power connections to third power converter 133 of third node controller 132. As such, external currents pass through third battery cell 134 and additional third battery cell 136, which may be the same or different. In this example, the power compensation (due to disconnecting first battery cell 114 for the leakage current testing) may be provided by various combinations of the remaining cells.

During this operation, the node current continues to flow through first node controller 112 as well as other node controllers (e.g., second node controller 122), which are connected in series with first node controller 112. At the same time, power conversion stage 162 turns on its internal bus-side FET continuously, thereby providing a path for the bus current to flow through power conversion stage 162 or, more generally, through the node controller.

Furthermore, in some examples, the pack voltage across (e.g., between first pack terminal 141 and second pack terminal 142 shown in FIG. 1B) remains substantially unchanged while the cell current through first battery cell 114 is discontinued. More specifically, the voltage of battery pack 100 remains substantially unchanged based on the power compensation provided by one or more additional cells in battery pack 100. Furthermore, in some examples, the power output of battery pack 100 during this operation (taking first battery cell 114 offline) remains substantially unchanged. For purposes of this disclosure, the term "substantially unchanged" means that the value of a parameter remains within the operating or allowable voltage range of load/supply 190, connected to battery pack 100. In some examples, the term "substantially unchanged" means that the change is less than 10%, less than 5%, less than 2% or even less than 1%. In general, one having ordinary skill in the art would understand the term "substantially unchanged" based on the specific configuration and/or application of battery pack 100.

Specifically, the pack voltage remains unchanged by operating one or more other battery cells in battery pack 100 according to a power compensation profile. The power compensation profile may be generated by battery pack controller 150 (e.g., before testing first battery cell 114). In some examples, the power compensation dynamically changes (e.g., revised by battery pack controller 150) based, e.g., on the overall power demand of battery pack 100, state of other cells in battery pack 100, and other like factors. More specifically, the power compensation profile is applied (block 234) to one or more battery cells in the same node (as first battery cell 114) and/or different nodes. Various power compensation profiles and examples will now be described with reference to FIGS. 3A-3C. Overall, the power compensation may be provided by battery cells of first battery node 110 and/or other battery nodes. The selection of the nodes and cells for this power compensation depends on the power output of battery pack 100, SOC of battery cells, and/or other like factors.

Figure 3A:
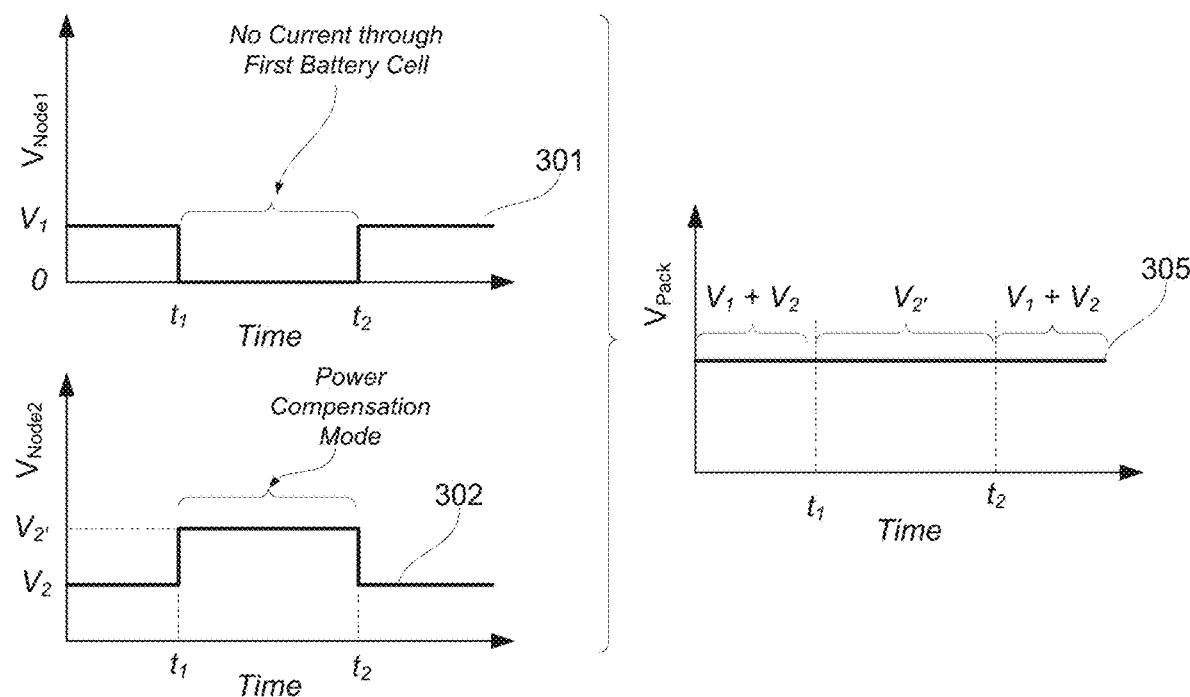
FIG. 3A illustrates node and pack voltages showing power changes on one node compensated by another node, in accordance with some examples.

FIG. 3A illustrates an example where the power losses, associated with taking first battery cell 114 offline, are compensated entirely by second battery node 120. This example also assumes that first battery node 110 comprises no other battery cells, besides first battery cell 114, or that these other cells are also taken offline at the same time. Furthermore, for clarity, this example assumes that battery pack 100 includes only two nodes, i.e., first battery node 110 and second battery node 120.

When first battery cell 114 is taken offline (at $t_1$), the initial voltage across first battery node 110 drops to zero ($V_{Node1}=V_1\to 0$). The voltage across first battery node 110 is represented by line 301 in FIG. 3A. At the same time, the initial voltage across second battery node 120 increases to a new value ($V_{Node2}=V_2\to V_{2'}$). The voltage across second battery node 120 is represented by line 302 in FIG. 3A. This new voltage value ($V_{2'}$) is identified in the power compensation profile and depends on the initial voltage across first battery node 110 ($V_{Node1}=V_1$) and the initial voltage across second battery node 120 ($V_{Node2}=V_2$). More specifically, this new voltage value is selected such that the pack voltage (line 305 in FIG. 3A) remains substantially the same ($V_{Pack}=V_1+V_2=V_{2'}$=const).

The voltage increase across second battery node 120 (from $V_2$ to V) is achieved by changing the operation of second node controller 122 based on the instructions from battery pack controller 150. Specifically, battery pack controller 150 instructs second node controller 122 to operate per the power compensation mode, supplied by battery pack controller 150 (e.g., increasing the voltage across second battery node 120). It should be noted that second node controller 122 controls the operation of second battery cell 124, which is now also operated per the power compensation mode. Second battery cell 124 provides a different power output, such that the power output change of second battery cell 124 is the same (but opposite) as the power output change of first battery cell 114 when first battery cell 114 is taken offline.

In one illustrative example, a pack with two nodes produces 300 W and has a bus current of 20 A and a bus voltage of 15V. The initial power contribution of the first node is 160 W, while the initial power contribution of the second node is 140 W. As such, the initial voltage across the first node is 8V (160 W/20 A), while the initial voltage across the second node is 7V (140 W/20 A). It should be noted that the voltage of the cells in both nodes may be different from the node voltages dues to the step-up/step-down functionality of the corresponding power converters. Once the cell in the first node is taken offline for testing, the node voltage drops to 0V (assuming there are no additional cells at the first node). The power contribution of the first node is now 0W (20 A×0V). The second node controller is instructed to increase the power contribution and voltage, which is not 15V across the second node. The power contribution of the second node is now 300 W. The overall performance of the battery pack remains the same (the power output of 300 W, the bus current of 20 A, and the bus voltage of 15V). In this illustrative example, all power losses due to taking the cell in the first node offline are compensated by the cell in the second node.

One having ordinary skill in the art would understand how the above examples can be scaled up to additional nodes. More specifically, multiple nodes are used for power compensation when a battery cell in one node is taken offline. For example, a battery pack may include 100 nodes. When a battery cell is tested in one of these nodes, and this node no longer contributes to the power output of the pack, battery cells in the remaining 99 modes may be used to compensate. For example, each of the battery nodes may equally contribute, e.g., 1/99 share of this total power compensation, which may be referred to as an even power compensation distribution. Alternatively, power compensation contributions from different nodes can be different, e.g., determined based on various cell conditions and cell operating parameters in these nodes. Furthermore, one having ordinary skill in the art would understand how the power compensation features are used when multiple cells are taken offline, e.g., either for testing or as a result of testing. For example, in a battery pack with 100 nodes, 5 battery cells may be taken offline such that the cells in other nodes (e.g., remaining 95 nodes) are used for power compensation.

Figure 3B:
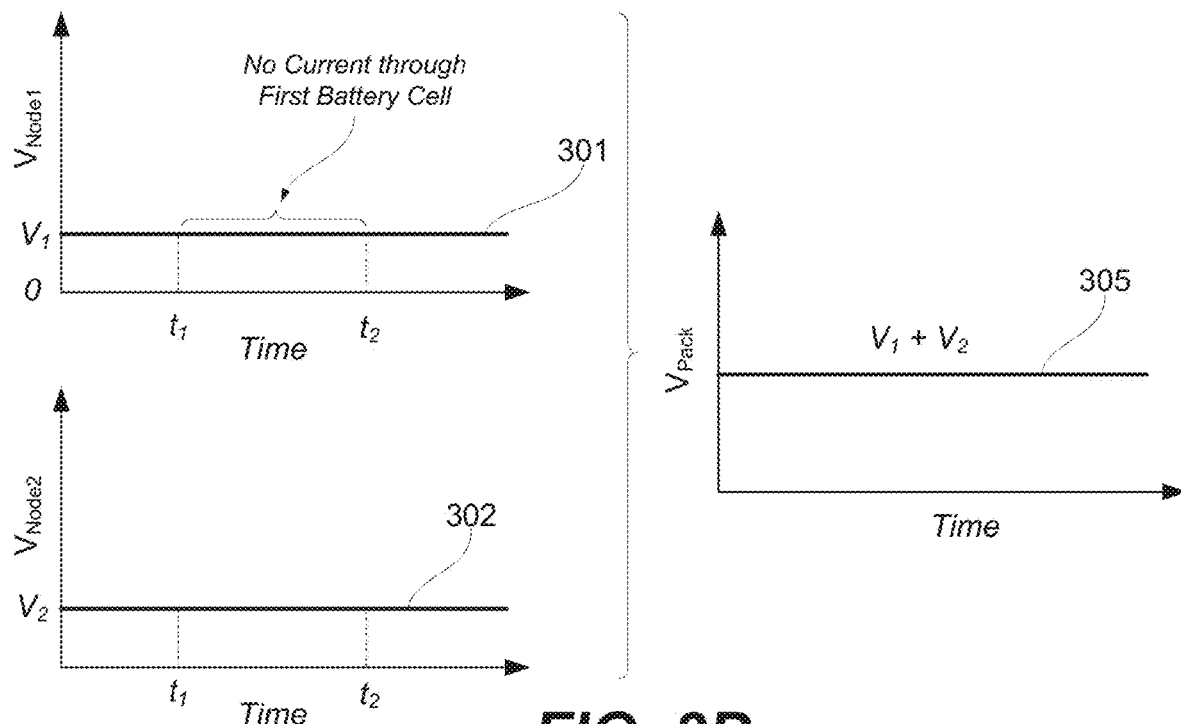
FIG. 3B illustrates node and pack voltages showing no power changes across the node, in accordance with some examples.
Figure 3C:
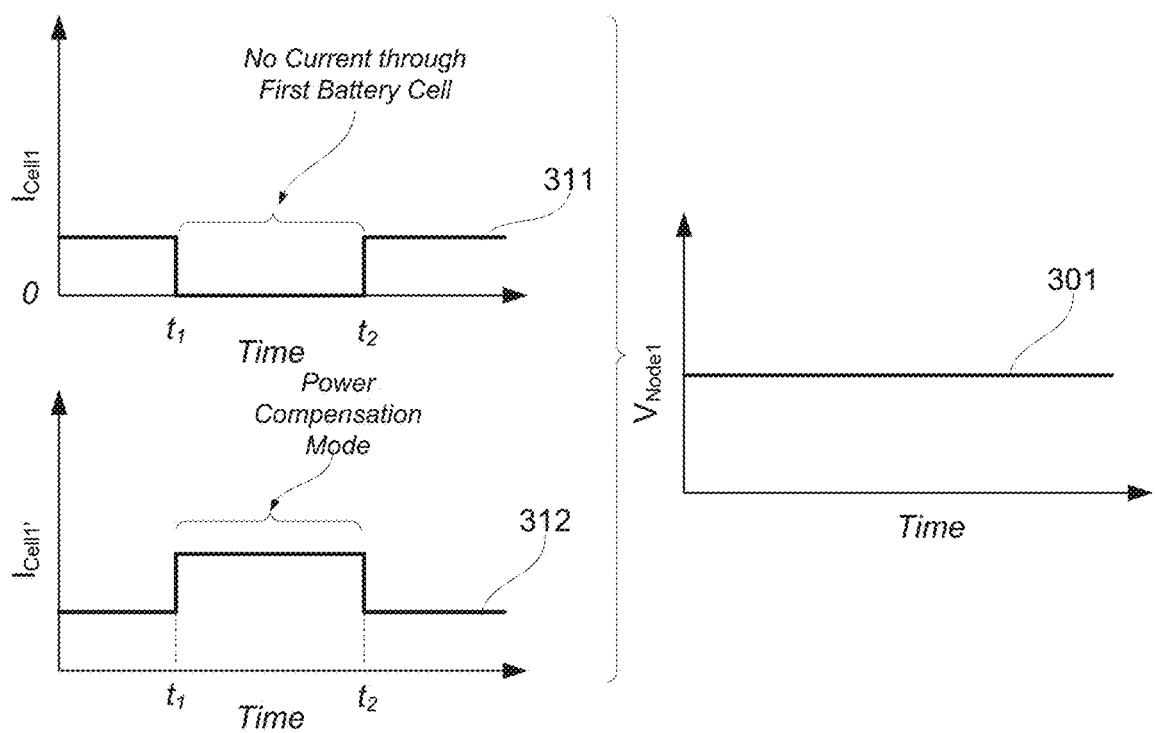
FIG. 3C illustrates cell currents and a node voltage showing a power compensation example within the node.

FIG. 3B and FIG. 3C illustrate another example, where power losses associated with taking first battery cell 114 offline are compensated entirely within first battery node 110. Specifically, FIG. 3B illustrates that the voltage (line 301) across first battery node 110 ($V_{Node1}=V_1$) and the voltage (line 302) across second battery node 120 ($V_{Node2}=V_2$) remain substantially the same as first battery cell 114 is taken offline (at $t_1$). Furthermore, the pack voltage (line 305) remains substantially the same ($V_{Pack}=V_1+V_2$). Overall, there are no changes to second battery node 120 and no changes are observed at the pack level as a result of taking first battery cell 114 offline.

Referring to FIG. 3C, the current (line 311) through first battery cell 114 drops to zero at t1 ($I_{Cell1}=0$). However, in this example, additional first battery cell 116, which is also a part of first battery node 110, entirely compensates for the power changes associated with discontinuing the cell current through first battery cell 114. FIG. 3C illustrates an increase of the current (line 312) through additional first battery cell 116 ($I_{Cell1}$ steps up at $t_1$). The level of this increase depends on the additional power needed or, more specifically, on the voltage across first battery cell 114 and current through first battery cell 114 before $t_1$. Briefly referring to FIG. 1D, power conversion stage 162 disconnects one of switches 161 to take the corresponding cell offline. At the same time, power conversion stage 162 controls the other one of switches 161, connected to the remaining cell, such that the voltage output of the power converter remains substantially the same.

In some examples, method 230 comprises determining (block 240) the leakage current of first battery cell 114. The leakage current may be determined based on the cell data obtained from first battery cell 114 while the external cell current is discontinued through first battery cell 114. For example, the cell data may comprise OCV changes resulting in first battery cell 114 being offline or, more specifically, an OCV profile of first battery cell 114. However, other examples of the cell data are also within the scope, e.g., a current needed for keeping a constant SOC of first battery cell 114. This operation may be performed by first node controller 112 and/or by battery pack controller 150. Furthermore, in some examples, the leakage current of first battery cell 114 is determined externally (e.g., battery data system 102), in which case the cell data (e.g., the OCV changes) is transmitted externally.

In one illustrative example, a tested cell is initially charged to 30% SOC of the total capacity. The cell is kept offline for 1 week (168 hours). The test is performed at 20° C. An OCV drop during this period is 0.2 mV, which corresponds to 0.02% SOC decrease (from the initial 30% SOC). Based on the capacity of this cell, this 0.02% SOC decrease over 168 hours corresponds to the leakage current of 0.1 mA. In some examples, the leakage current is expressed in terms of capacity, e.g., 1 C corresponding to going from 0% to 100% SOC in one hour. Based on this designation, the leakage current in the above example is $1.2 \times 10^{-6}$ C.

Figure 4A:
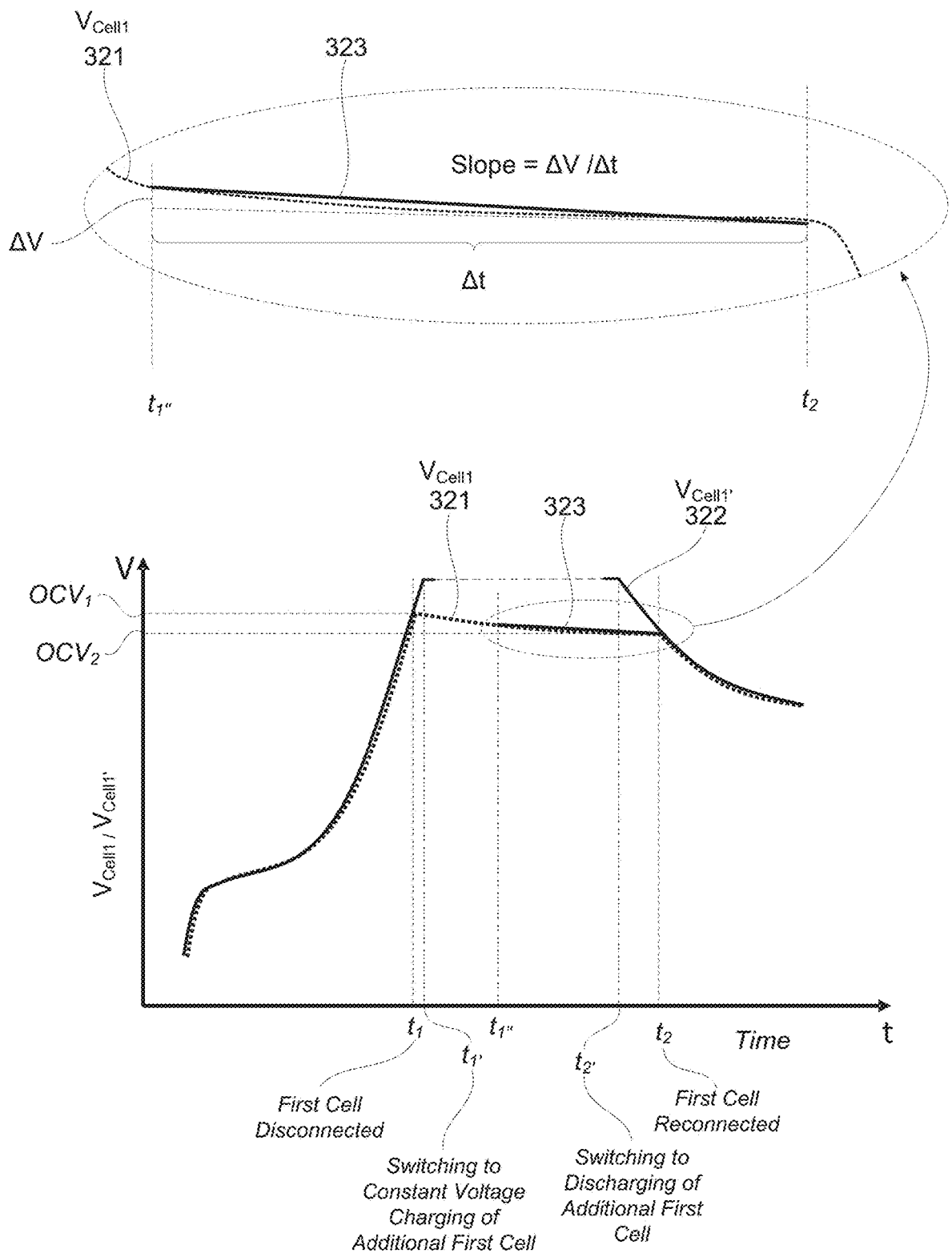
FIG. 4A is an example of measuring OCV changes of a battery cell to determine leakage current.

One example of the OCV profile is shown in FIG. 4A. The OCV profile spans over a sufficient period, which may depend on how evident the leakage current is (e.g., the amount of leakage current, the precision of measuring equipment, the required accuracy, and other like factors). For example, smaller current leaks may require longer testing durations to detect sufficient voltage drops. In some examples, the duration is at least 24 hours or, more specifically, at least 168 hours. The duration for OCV measurement (e.g., first battery cell 114 being offline) depends on the SOC of first battery cell 114, the temperature of first battery cell 114, and calendar age and cycle count of first battery cell 114 as further described below with reference to FIGS. 4B and 4C. Furthermore, the duration may depend on the precision of the measuring tools, required data precision, and the actual leakage current (e.g., a shorter duration for very leaky cells). In some examples, the period, during which the OCV changes are monitored, is dynamically selected/adjusted based on the identified OCV changes (e.g., extended if the OCV changes are not sufficiently detectable). Furthermore, this period may also depend on battery pack's ability to operate with first battery cell 114 being offline.

Specifically, FIG. 4A illustrates voltage profiles of two cells, such as first battery cell 114 ($V_{Cell1}$—represented by line 321) and additional first battery cell 116 ($V_{Cell1}'$—represented by line 322). At $t_1$, first battery cell 114 is taken offline, while additional first battery cell 116 continues to charge. At this point, the OCV of first battery cell 114 is at $OCV_1$ level. First node controller 112 obtains the OCV profile of first battery cell 114 and reports this OCV profile to battery pack controller 150 for analysis and determining leakage current of first battery cell 114. First battery cell 114 remains offline until $t_2$ and the OCV profile may be obtained for this entire duration.

At $t_{1'}$, additional first battery cell 116 is switched to a constant voltage charging and continues at this mode until $t_{2'}$, at which point, additional first battery cell 116 starts discharging. It should be noted that in some examples, additional first battery cell 116 may be subjected to multiple charge-discharge cycles, between $t_1$ and $t_2$, and while first battery cell 114 is tested. At $t_2$, first battery cell 114 is brought back to the offline mode and continues to discharge together with additional first battery cell 116. This operation is referred to as reestablishing the cell current through first battery cell 114 and is described below with reference to block 280.

In some examples, the duration of the leakage current measurement is controlled by the SOC of the tested cell and the operation of other cells in battery pack 100, e.g., cells responsible for power compensation. Referring to FIG. 4A, the tested cell is brought online when the SOC of the tested cell matches that of other cells in battery pack 100 (e.g., the SOC corresponds to the voltage of the cell). In some examples, a SOC level, at the time the cell is taken offline, is specifically selected to (a) provide sufficient power back up (e.g., a high SOC) and/or (b) provide sufficient testing duration (e.g., increase the time between $t_1$ and $t_2$). In some examples, other cells in battery pack 100 undergo multiple charge-discharge cycles before the tested cell is brought back online.

Overall, in some examples, determining (block 240) the leakage current of first battery cell 114 comprises obtaining (block 242) multiple OCV data (e.g., in the form of an OCV profile) and analyzing (block 244) this OCV data and/or leakage current data. The OCV data is obtained using first node controller 112 or, more specifically, voltage probes connected to telemetry module 168. It should be noted that while the OCV data is obtained, first node controller 112 remains disconnected from power conversion stage 162 of first node controller 112 by keeping the corresponding power switch open. The OCV data is analyzed by battery pack controller 150. For example, a linear regression of the OCV data, which may be referred to as OCV(t), is performed.

In some examples, method 230 further comprises monitoring (block 243) the temperature/obtaining the temperature readings of the tested cell, e.g., during the entire period of the leakage current testing. The effect of the temperature on leakage current is described with reference to FIG. 4C. Therefore, in these examples, the analysis of leakage current is performed in the context of the cell temperature during the leakage current testing (e.g., OCV monitoring).

Referring to FIG. 4A, in some examples, the asymptotic portion of the OCV profile (line 321) is approximated with linear trend-line 323. Specifically, this asymptotic portion is identified between period $t_{1''}$ and period $t_2$. This period may be referred to as OCV data sampling period. The slope of this linear trend-line ($\Delta V/\Delta t$) represents the rate of SOC decrease, due to the leakage current. More specifically, for a given cell capacity, the leakage current is calculated based on the rate of SOC decrease. Alternatively, further analysis (e.g., degradation mechanism determination) is based on the SOC change rate.

In some examples, analyzing (block 244) the OCV data comprises characterizing the battery cell condition and/or determining one or more possible degradation mechanisms. For example, a leakage current is first calculated from the OCV data as described above with reference to FIG. 4A. If the leakage current is less than a first threshold (e.g., $I_{leak} < I_{warning}$), then the original operating parameters are used for the cell going forward. The leakage current testing is repeated, e.g., after between 10 days and 365 days or, more specifically, between 14 days and 60 days. In some examples, $I_{warning}$ is between C/20,000 and C/4,000 or, more specifically, between C/10,000 and C/6,000. In some examples, $I_{warning}$ corresponds to $(\Delta OCV/\Delta t)_{warning}$ of between 0.5 mV/day and 10 mV/day or, more specifically, 1 mV/day and 2 mV/day, e.g., for lithium-ion cells.

However, if the leakage current is greater than the first threshold (e.g., $I_{leak} > I_{warning}$), then the leakage current is compared to a second threshold (e.g., $I_{failure\_warning}$). Continuing with this example, if the leakage current is less than the second threshold (e.g., $I_{leak} < I_{failure\_warning}$), then a warning is associated with this cell. The cell may be subjected to advanced cell balancing, e.g., voltage balancing, cell power limiting, and/or internal resistance balancing. In some examples, $I_{failure\_warning}$ is between C/10,000 and C/1,000 or, more specifically, between C/6,000 and C/2,000. The ratio of the first and second leakage current thresholds (i.e., $I_{warning}/I_{failure\_warning}$) may be between 1.2 and 4 or, more specifically, between 1.5 and 2.5. In some examples, $I_{failure\_warning}$ corresponds to $(\Delta OCV/\Delta t)_{failure\_warning}$ of between 1 mV/day and 25 mV/day or, more specifically, 2 mV/day and 10 mV/day, e.g., for lithium-ion cells.

On the other hand, if the leakage current is greater than the second threshold (e.g., $I_{leak} > I_{failure\_warning}$), then the leakage current is compared to a third threshold (e.g., $I_{leak} < I_{severe}$). Continuing with this example, if the leakage current is less than the third threshold (e.g., $I_{leak} < I_{severe}$), then a severe warning is associated with this cell. The cell may be subjected to various mitigation strategies, such as using lower charge voltage, voltage balancing, cell power limiting, converging to the knee at the same point, under-voltage (UV) and over-voltage (OV) protection, higher SOC, temperature control, current protection, internal resistance, and others. For a cell with a severe warning, a new leakage current testing may be scheduled thereafter, e.g., 1 day to 60 days or, more specifically, after 7 days to 30 days. In some examples, $I_{severe}$ is between C/5,000 and C/200 or, more specifically, between C/2,000 and C/5,000. The ratio of the first and second leakage current thresholds (i.e., $I_{failure\_warning}/I_{severe}$) may be between 2 and 10 or, more specifically, between 3 and 6. In some examples, $I_{severe}$ corresponds to $(\Delta OCV/\Delta t)_{severe}$ of between 5 mV/day and 100 mV/day or, more specifically, 10 mV/day and 40 mV/day, e.g., for lithium-ion cells. Finally, if the leakage current is greater than the third threshold (e.g., $I_{leak} > I_{severe}$), then a severe degradation mechanism or even a failure mode is associated with this cell. The cell may discharge to a low/safe voltage (e.g., less than 3V for lithium-ion cells) and be permanently bypassed. Overall, analyzing (block 244) the leakage current data may comprise setting a timeframe for a new leakage current testing for first battery cell 114 based on the currently determined leakage current.

In some examples, analyzing (block 244) the leakage current data comprises comparing the identified leakage current (and other conditions, if available, e.g., temperature) to known test data models. These test data models may be provided from battery data system 102. Furthermore, in some examples, analyzing (block 244) the OCV data comprises trending the leakage current data for the tested cell over time, which may be referred to as historical trending analysis. For example, the same cell may be tested (for the leakage current) multiple times over the operating lifetime of this cell.

In some examples, analyzing (block 244) the OCV data and/or leakage current data comprises comparing the data of the tested cell to reference data (e.g., average data for other cells in the same battery pack or fleet-wide data available from battery data system 102). The reference data may be selected based on various conditions, such as cell temperature during testing, SOC during the test, and others.

In some examples, analyzing (block 244) the leakage current data (or, more specifically, the OCV data) comprises determining (block 245) one or more degradation mechanisms and, in more specific examples, the severity of each particular degradation mechanism. Some examples of these degradation mechanisms are an internal mechanical short, gas evolution, solid electrolyte interface, or metal dendrite formation. It should be noted that other cell characteristics (besides the OCV data) may be used for the degradation mechanism determination. For example, OCV data at a low SOC may be used for determining the decomposition of the electrolyte on the negative electrode. OCV data at a high SOC may be used for determining oxidation on the positive electrodes, gassing caused by the reduction on the negative electrodes, and/or development of mechanical shorts inside the cell. Dendrite formation may be determined from OCV data at both low and high SOC. More specifically, analyzing the OC data may involve monitoring changes in the leakage current at different SOC and/or after different number cycles.

For example, different degradation mechanisms may have one or more unique leakage current fingerprints, which allow distinguishing among the degradation mechanisms, e.g., differentiate lithium plating events from internal short events and gassing events. These fingerprints will now be described in more detail with reference to degradation-mechanism determination protocols. Starting with lithium plating and with reference to FIG. 5A, a leakage current caused by lithium plating (line 502) tends to decrease over time, e.g., from a higher value corresponding to the initial leakage current ($I_{L\text{-}init}$) to a lower value corresponding to the stable leakage current ($I_{L\text{-}s}$). The initial leakage current is higher due to the presence of the freshly-plated lithium metal on the negative electrode. This fresh lithium triggers various reactions, described above, which in turn cause the leakage current due to the material and electron transfer within the cell. These reactions consume and passivate the lithium metal, which slows the reaction rate and reduces the corresponding leakage current.

Figure 5A:
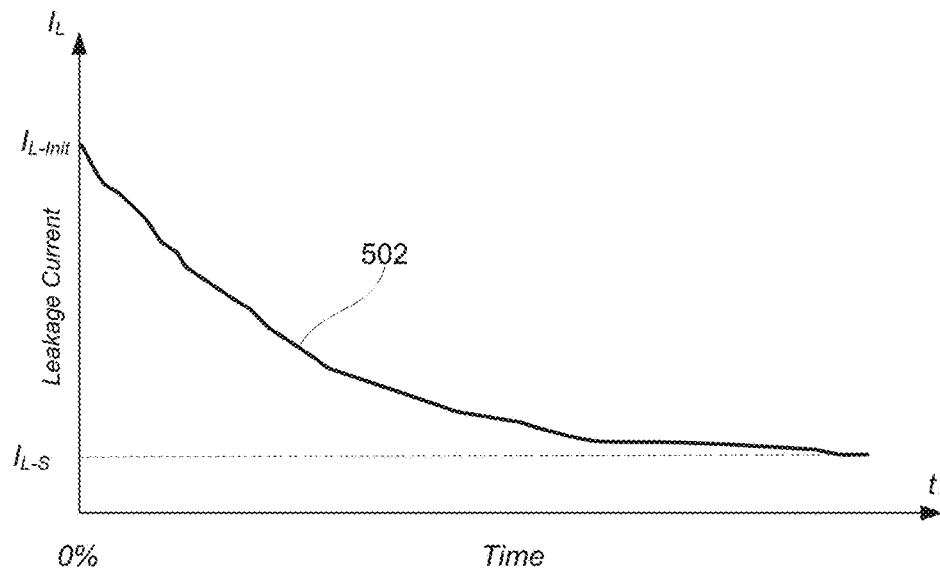
FIGS. 5A-5D are various leakage current profiles corresponding to lithium plating events, in accordance with some examples of degradation-mode determination protocols.
Figure 5B:
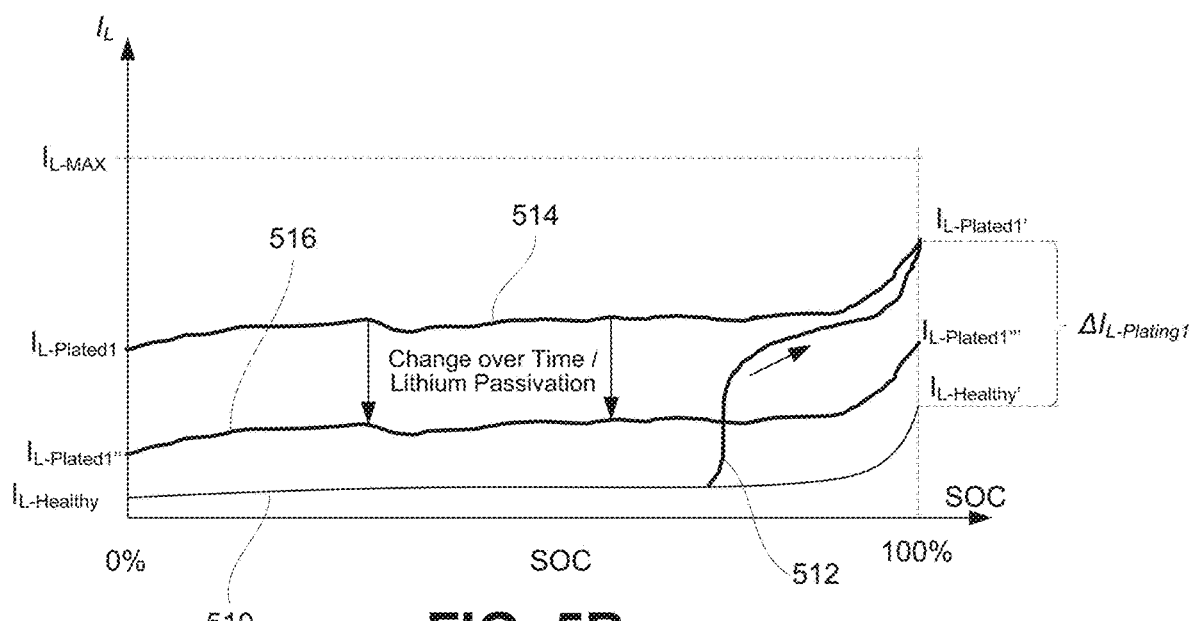

Referring to FIG. 5B, line 510 corresponds to a cell with no or minimal lithium plating, which may be referred to as a healthy cell. The leakage current ($I_{L\text{-}Healthy}$) is minimal for the most SOC range, with a slight increase as the cell approaches a fully-charged state (i.e., SOC of 100%). This increased leakage current is shown as $I_{L\text{-}Healthy'}$ in FIG. 5B. A lithium plating event of the cell is presented by line 512. One having ordinary skill in the art would understand that the lithium plating event typically occurs above a certain minimal SOC. In other words, the cell needs to be sufficiently charged and enough lithium transferred to the negative electrode for lithium plating to occur. Upon the lithium plating and assuming the cell continues to be charged, the leakage current increases to a new level ($I_{L\text{-}Plated1'}$). As described above, freshly-plated lithium metal triggers various side reactions, resulting in an additional leakage current ($\Delta I_{L\text{-}Plating1}$). If the cell is discharged soon after the lithium plating event (without allowing the plated lithium metal to passivate), then the leakage current profile follows line 514. However, over time, the lithium metal passivates and line 514 transitions into line 516, corresponding to lower leakage currents across the entire SOC range. The passivation process and the decrease in leakage current are described above with reference to FIG. 5A.

It should be noted that FIG. 5B illustrates an example of only one lithium plating event. If no further plating events occur, then the leakage current profile stays at line 516 or even drops down to the level represented by line 510. For example, a previously formed SEI layer may be lost due to the plating while a new SEI layer may not be easily formed. In this example, a single plating event may not bring the leakage current above the threshold value ($I_{L\text{-}MAX}$).

Figure 5C:
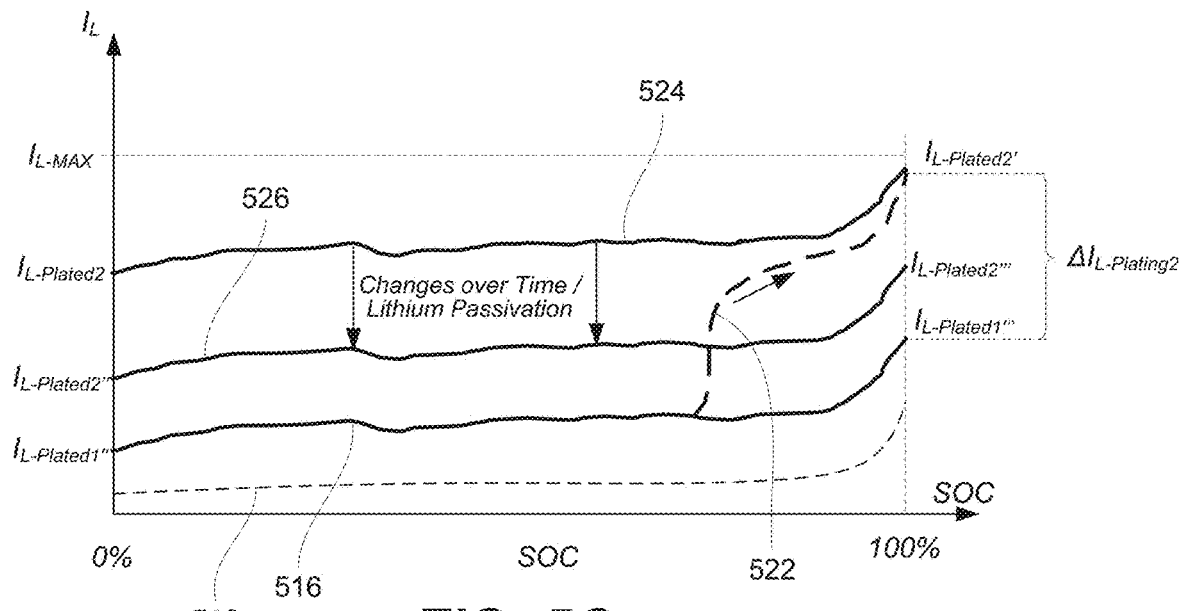
Figure 5D:
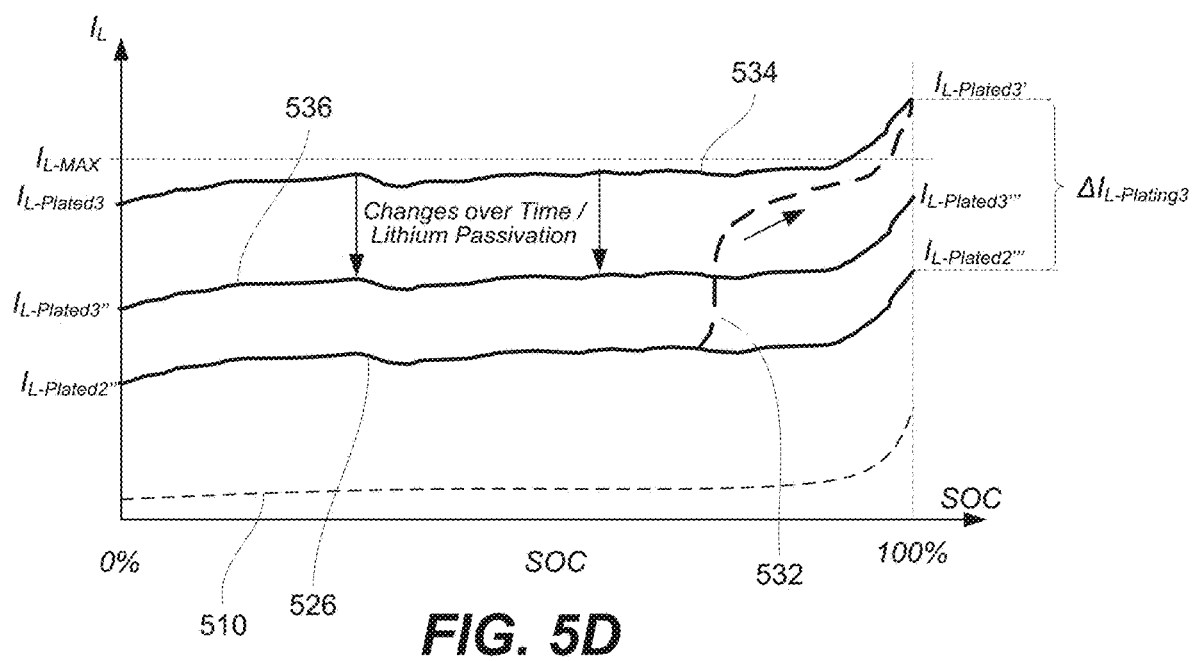

FIGS. 5C and 5D illustrate additional plating events. These events may occur during each charging or during charging at certain conditions (e.g., over a certain SOC level, above at a certain charge rate, while the cell is above a certain temperature, and others). Referring to FIG. 5C, before any additional plating events, the leakage current profile is represented by line 516, which is the same line as in FIG. 5B. The leakage current profile already reflects the previous plating event, described above with reference to FIG. 5B. A new lithium plating event of this cell is reflected by line 522. Upon the lithium plating and assuming the cell is fully charged, the leakage current increases to a new level ($I_{L\text{-}Plated2'}$). If the cell is discharged soon after this new lithium plating event and without allowing the newly plated lithium metal to passivate, then the leakage current profile follows line 524. However, over time the lithium metal passivates, and line 524 transitions into line 526. In this example, this additional plating event may also not bring the leakage current above the threshold value ($I_{L\text{-}MAX}$).

FIG. 5D reflects yet another plating event. Before this new plating event, the leakage current profile is represented by line 526, which is the same line as in FIG. 5C. The leakage current profile already reflects multiple previous plating events, described above with reference to FIGS. 5B and 5C. A new lithium plating event of this cell is reflected by line 532. Upon the lithium plating and assuming the cell is fully charged, the leakage current increases to a new level ($I_{L\text{-}Plated3'}$). As before, if the cell is discharged soon after this new lithium plating event and without allowing the newly plated lithium metal to passivate, then the leakage current profile follows line 534. However, over time the lithium metal passivates, and line 534 transitions into line 536. In this example, line 534 exceeds the threshold value ($I_{L\text{-}MAX}$), which may be used to take the cell offline or adjust the operating parameters of the cell. In the same or other examples, a rate of increase (e.g., a sharp leakage current increase in the same cycle or over a small number of cycles) is used as criteria to adjust the operating parameters of the cell.

While FIGS. 5A-5D illustrate an example of three plating events, one having ordinary skill in the art would understand that any number of plating and/or other degradation mechanisms are within the scope. The above example is used to present an illustrative signature of leakage current profiles corresponding to lithium plating, e.g., to differentiate lithium plating from other degradation mechanisms. This signature may be used to determine if a particular cell has experienced one or more lithium plating events from one or more leakage current profiles, identified during in-situ testing of the cell. Furthermore, battery pack controller 150 and/or battery data system 102 may determine a cause of these lithium plating events (e.g., cell defects) and, in some examples, develop new operating parameters for the cells to avoid future lithium plating.

Figure 6A:
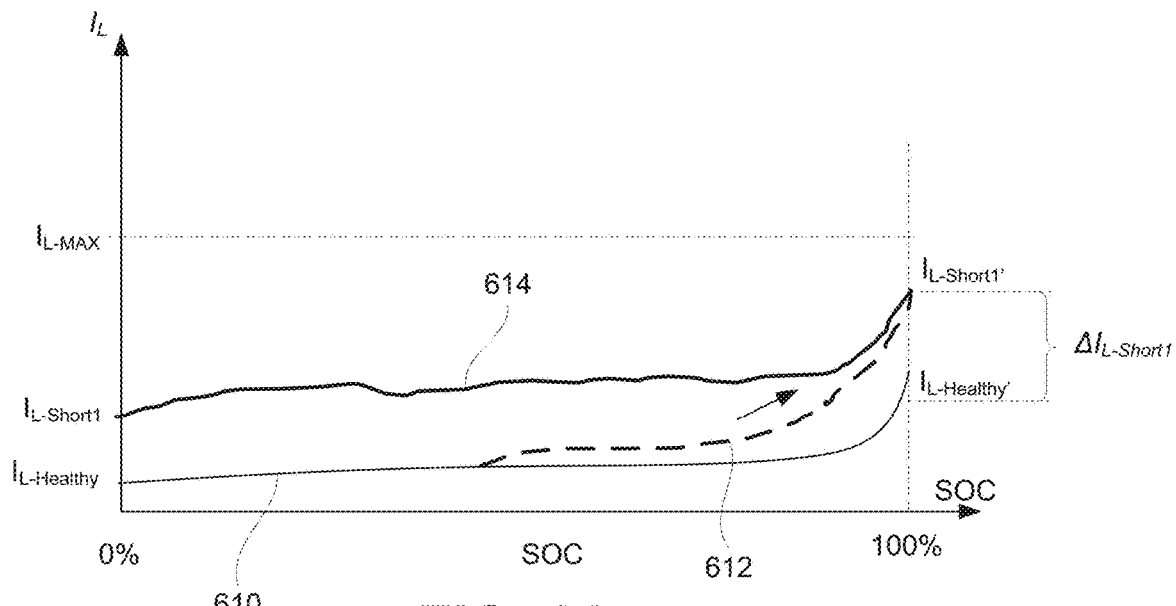
FIGS. 6A-6B are two leakage current profiles corresponding to internal short events, in accordance with some examples of degradation-mode determination protocols.
Figure 6B:
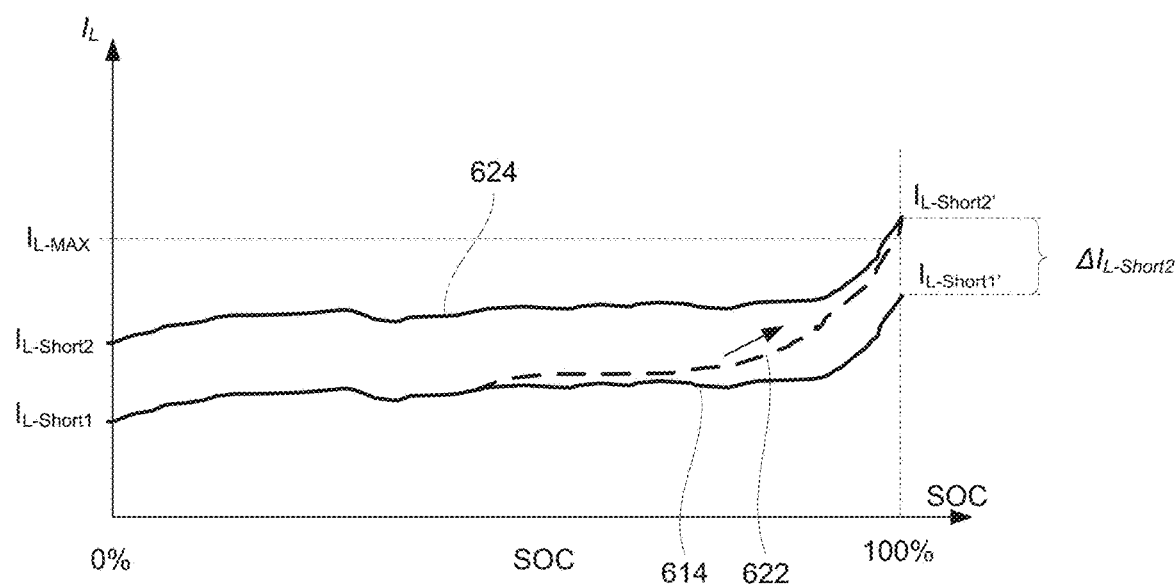

FIGS. 6A and 6B illustrate a signature of leakage current profiles corresponding to internal shorts. Unlike lithium plating, once an internal short occurs, the leakage current tends to remain the same over time. Generally, there are no passivation/self-curing options for internal short events, unlike lithium plating. However, at very high values of leakage currents, the leakage currents may cause changes in the SOC, which in turn affect leakage currents. For small leakage currents, the SOC impact is negligible for typical test durations. In general, a leakage current, caused by an internal short, increases with a SOC as the pressure is built up between the electrodes.

Referring to FIG. 6A, line 610 corresponds to a cell with no or minimal internal shorts, which may be referred to as a healthy cell. The leakage current ($I_{L-Healthy}$) is minimal for the most SOC range with a slight increase toward a fully-charged state (i.e., SOC of 100%—shown as $I_{L-Healthy'}$). An internal short event of the cell is presented with line 612. In this example, the cell continues to charge after the internal short event occurs, and the leakage current increases to a new level ($I_{L-short1}$). Specifically, the internal short provides new paths for the leakage current, e.g., corresponding to $\Delta_{L-short1}$. As the cell is discharged, the leakage current profile follows line 614.

It should be noted that FIG. 6A illustrates only one internal short event. If no further short events occur, then line 614 continues to represent the leakage current profile of this cell.

Line 614 is positioned above line 610 as the newly developed shorts continue to provide additional paths for the leakage current in comparison to the cell before the internal short event. As shown in FIG. 6A, a single plating event may not bring the leakage current above the threshold value ($I_{L-MAX}$).

FIG. 6B illustrates an additional short event. Overall, one or more short events may occur during various operations of the cell, e.g., charging when the internal pressure of the cell increases and the shorts become more evident. Referring to FIG. 6B, before an additional internal short event, the leakage current profile is represented by line 614, which is the same profile as shown in FIG. 6A. This leakage current profile already reflects the previous internal short event, which is described above with reference to FIG. 6A. A new internal short event is represented by line 622. As the cell continues to charge, the leakage current increases to a new level ($I_{L-short2'}$). As the cell is discharged, the leakage current profile follows line 624. In this example, line 624 exceeds the threshold value ($I_{L-MAX}$), at least at the high SOC levels.

Figure 7A:
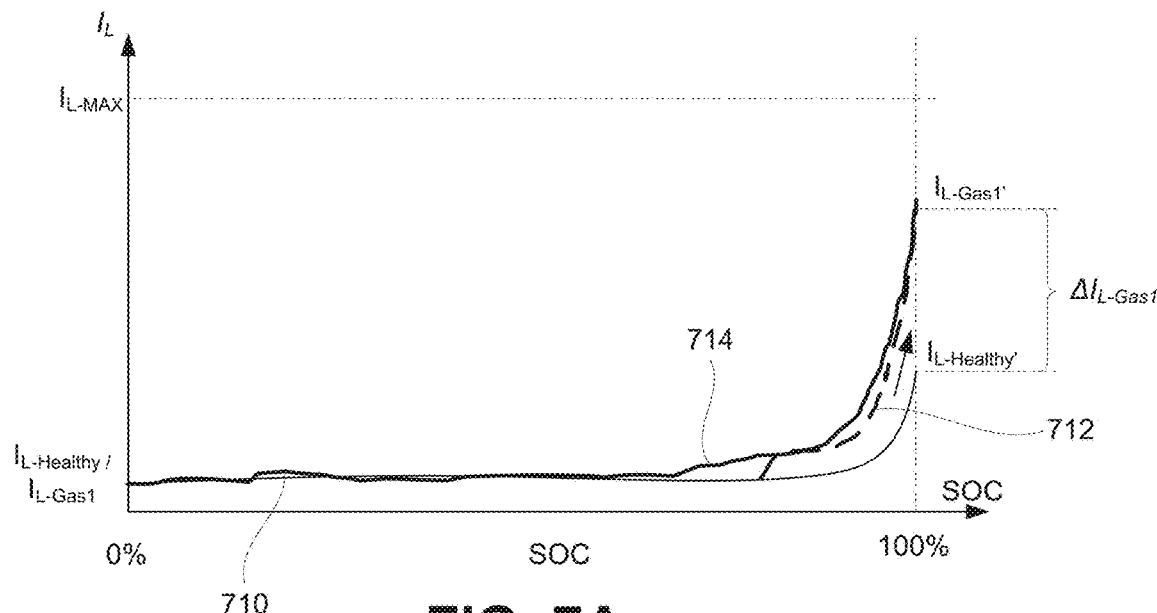
FIGS. 7A-7B are various leakage current profiles corresponding to gassing events, in accordance with some examples of degradation-mode determination protocols.
Figure 7B:
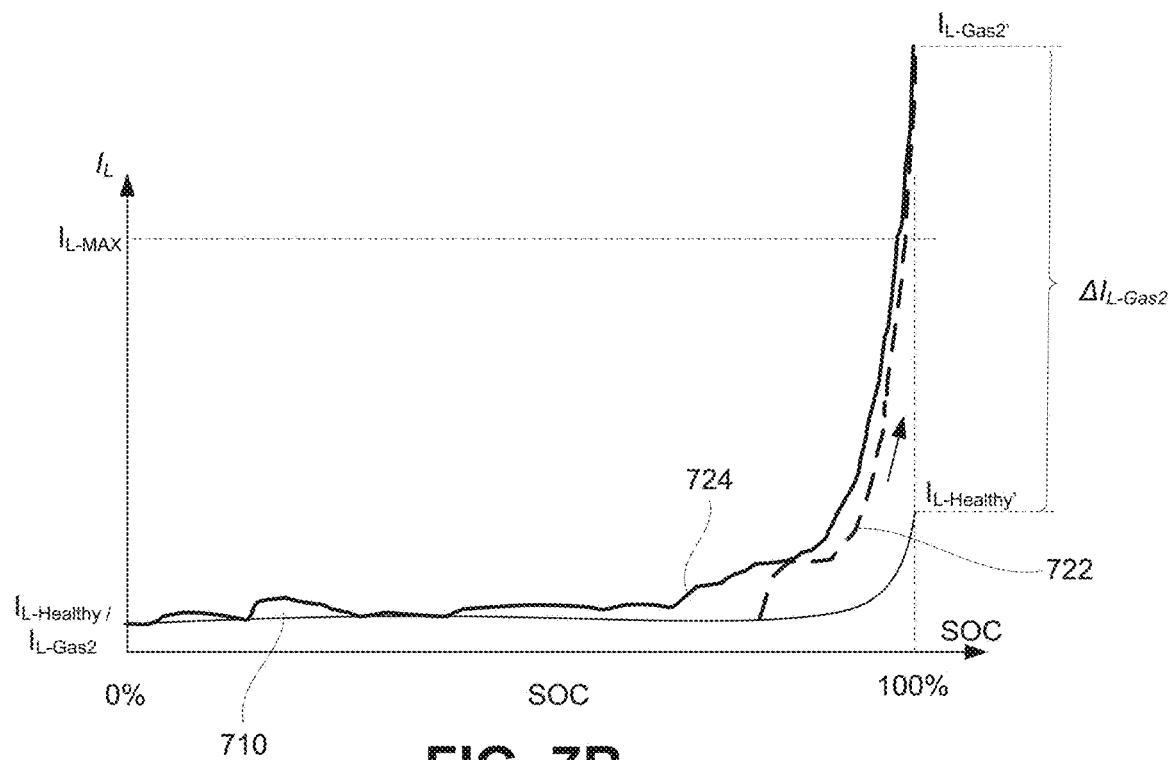

FIGS. 7A and 7B illustrate a signature of leakage current profiles corresponding to gassing within a battery cell. A gassing event may be caused by overcharging, by consuming electrolyte additives, and/or by reacting various catalytic materials on the positive electrode. The leakage current signature of this degradation mechanism is typically not time-dependent but strongly influenced by the SOC. The gassing event may be detected by a very sharp increase in leakage current at high levels of the SOC as, e.g., schematically shown in FIGS. 7A and 7B.

Referring to FIG. 7A, line 710 corresponds to a cell with no or minimal gassing, which may be referred to as a healthy cell. The leakage current ($I_{L-Healthy}$) is minimal for the most SOC range with a slight increase for the fully-charged cell (i.e., SOC of 100%—shown as $I_{L-Healthy'}$). A gassing event of the cell is shown by line 712. In this example, the cell continues to charge after the gassing event, and the leakage current increases to a new level ($I_{L-Gas'}$). As the cell is discharged, the leakage current profile follows line 714. At low SOC values, line 714 may be substantially the same as line 710.

FIG. 7B illustrates an additional gassing event. Overall, any number of gassing events may occur during various operations of the cell. Referring to FIG. 7B, before an additional internal short even, the leakage current profile may be still represented by line 710. In other words, there is no or minimal cumulative effects of previous gassing events. A new gassing even is shown by line 722. As the cell continues to charge, the leakage current increases to a new level ($I_{L-Gas2'}$). As the cell is discharged, the leakage current profile follows line 724. In this example, line 724 exceeds the threshold value ($I_{L-MAX}$), at least at the high SOC levels.

Overall, determining (block 245) one or more degradation mechanisms of first battery cell comprises comparing the leakage current of first battery cell 114 with different degradation mechanism signatures. These signatures may be available at battery data system 102 based on testing of other battery cells (e.g., equivalent to first battery cell 114) at various conditions (e.g., temperatures) and/or previous operating histories (e.g., charge/discharge rates).

In some examples, analyzing (block 244) the leakage current data (or, more specifically, the OCV data) comprises determining new operating parameters (an operating mode) for the tested battery based on this analyzed data. For example, the maximum charge/discharge current through the cell may be reduced (e.g., below one of the threshold operating current levels) if the leakage current exceeds one or more threshold leakage current levels. In another example, the tested battery cell is taken completely offline (e.g., after a controlled discharge) if the leakage current is severe and exceeds a set threshold. The external cell current through first battery cell 114 is reestablished according to these new operating parameters. For example, the external cell current is reestablished at a new level, different from a level, before determining the leakage current.

Figure 4B:
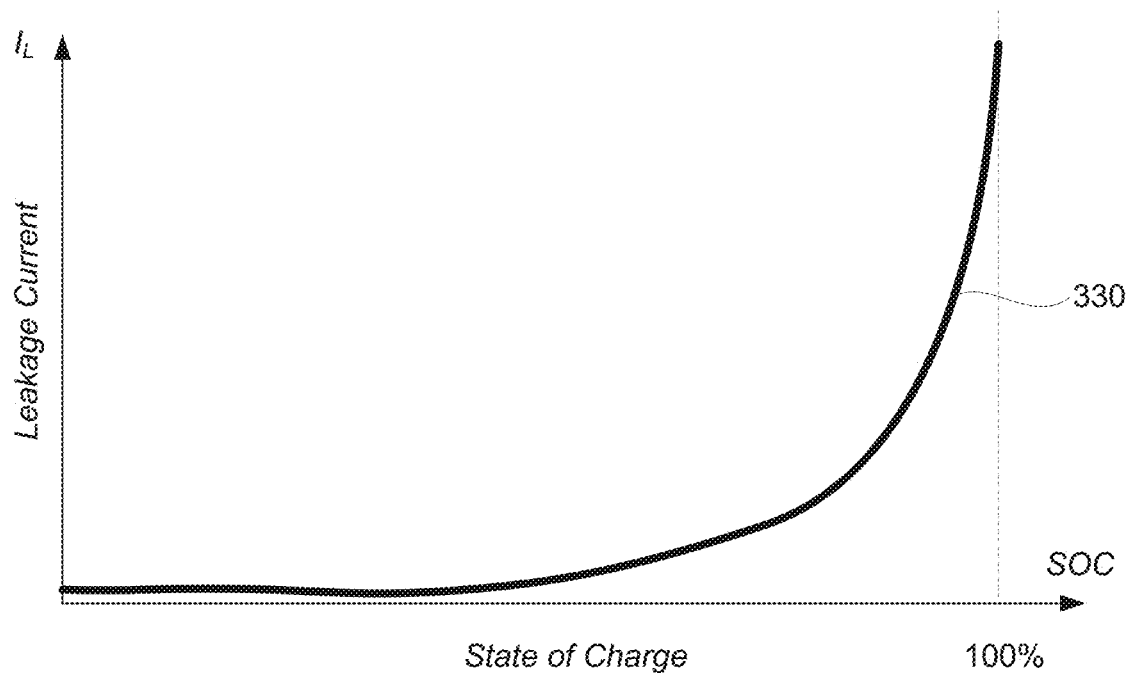
FIG. 4B is an example of a leakage current profile as a function of the SOC.
Figure 4C:
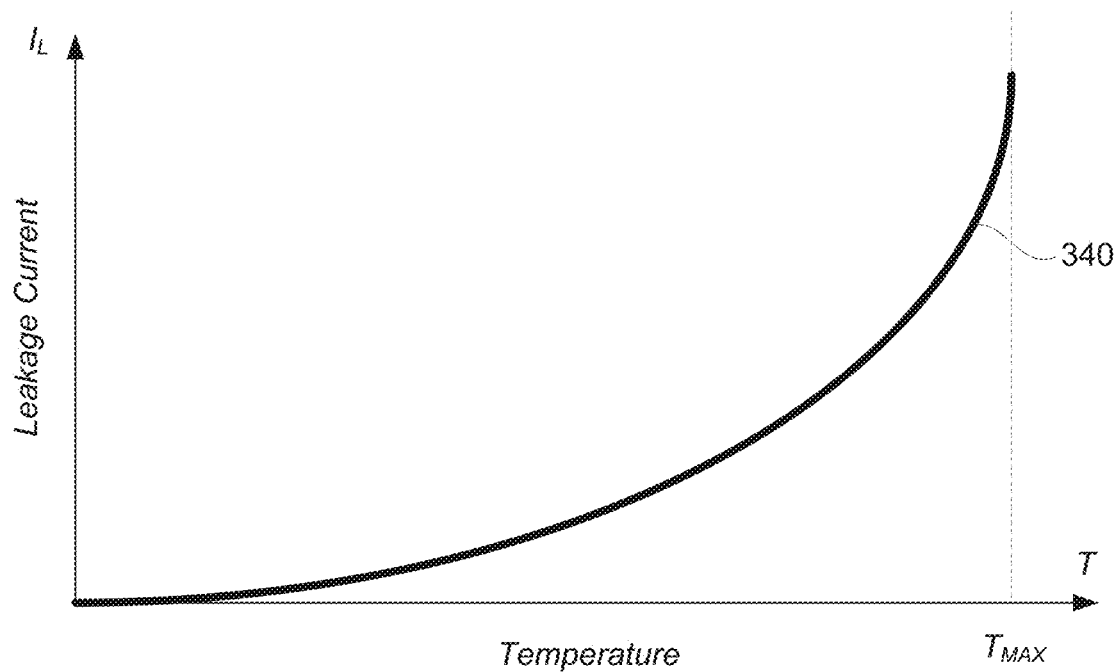
FIG. 4C is an example of a leakage current profile as a function of the temperature.

It should be noted that the leakage current depends on the SOC, temperature, pressure, and other characteristics, which may be taken into account when analyzing OCV changes and determining the leakage current. FIG. 4B is a schematic illustration of the leakage current ($I_L$) as a function of the SOC, represented by line 330. FIG. 4C is a schematic illustration of the leakage current ($I_L$) as a function of the temperature, represented by line 340. As a general trend, the leakage current increase with the temperature.

In some examples, method 200 further comprises transmitting (block 250) the cell data, e.g., the data representing the leakage current of first battery cell 114 from battery pack 100 to battery data system 102. As described above with reference to FIG. 1A, battery data system 102 is communicatively coupled to battery pack 100 and is configured to receive, aggregate, and analyze various types of cell data and pack data. In some examples, method 230 further comprises aggregating (block 260) the cell data received from battery pack 100 (e.g., the data representing the leakage current of first battery cell 114) with additional cell data (e.g., additional leakage current data). For example, this additional cell data may represent previous testing of first battery cell 114 and/or other cells (in the same battery pack and/or different battery packs). In some examples, this additional leakage current data is received by battery data system 102 from a fleet of power systems comprising battery packs, equivalent to battery pack 100. For example, these battery packs may have the same types of cells. This aggregation operation forms at least a portion of aggregate battery data. In some examples, battery data system 102 analyzes this aggregate battery data (as, e.g., described above with reference to FIG. 2A).

In some examples, method 230 further comprises receiving (270), at battery pack 100 and from battery data system 102, one or more of a leakage current testing protocol, a power compensation protocol, a cell operating protocol, or a degradation-mechanism determination protocol. For example, battery data system 102 generates one or more of these protocols based on a comprehensive analysis of cell data as, e.g., described above with reference to FIG. 2A. In some examples, these protocols are specific and unique to first battery cell 114, e.g., based on the cell data obtained from first battery cell 114, such as the leakage current.

In some examples, method 200 further comprises reestablishing (block 280) the external current through first battery cell 114. This operation is performed while battery pack 100 remains operational. For example, other cells in battery pack 100 may continue to charge or discharge based on the overall power output of battery pack 100. In some examples, the pack voltage and/or the pack power output remain substantially the same while the current through first battery cell 114 is reestablished. The power compensation for this current reestablishing operation is provided by one or more other battery cells in the pack in a manner similar when the external current is discontinued through first battery cell 114, which is described above.

In more specific examples, this current reestablishing operation is performed using first node controller 112, e.g., based on instructions from battery pack controller 150 and such that the bus voltage across the first node controller 112 and the second node controller 122 (i.e., $V_{NODE1}+V_{NODE2}$) remains substantially unchanged. In some examples, first battery cell 114 is brought back online when the SOC of this cell corresponds to the SOC of other cells in the pack, e.g., within 10% or, more specifically, within 5% of other cells. In the same or other examples, first battery cell 114 is brought back online when the OCV of first battery cell 114 is within 50 mV or, more specifically, within 10 mV of the SOC of the other cells. This SOC/OCV matching helps reduce the surge current through any cells, e.g., when cells are reconnected in parallel (in the same node) at different voltages. Furthermore, in some examples, this current reestablishing operation involved charging or discharging first battery cell 114 at a different rate (a higher rate or a lower rate) to match the SOC of first battery cell 114 to other cells in battery pack 100.

In some examples, the decision regarding the operation represented by block 280 is based on the leakage current of first battery cell 114. For example, if the leakage current of first battery cell 114 is above a certain threshold (e.g., more than 10 times the nominal leakage current for a particular battery type), then first battery cell 114 is slowly discharged through normal operation of battery pack 100 to a SOC of less than 10%, after which first battery cell 114 is taken offline and permanently remains offline. If first battery cell 114 is the only cell in the node, then the entire node is permanently bypassed. Alternatively, if additional cells are present in the node, then the switch connected to first battery cell 114 remains open.

In some examples, reestablishing (block 280) the external cell current through first battery cell 114 is performed after at least one other battery cell in battery pack 100 has undergone one or more charge-discharge cycles, while external cell current has been discontinued through first battery cell 114. For example, battery pack 100 may remain in operation and continue being charged and discharged while first battery cell 114 is being tested for the leakage testing.

Referring to FIG. 2B, in some examples, method 200 comprises switching (block 282) one or more cells back from the power compensating profile. This operation is triggered simultaneously with reestablishing the cell current through first battery cell 114 such that the pack output is not impacted by bringing first battery cell 114 online.

It should be noted that a specific application of battery pack 100 may provide various input into leakage current test frequency, duration, starting point, and others. For example, a typical electrical vehicle is charged overnight, with a full charge being achieved in the middle of the night. Alternatively, in a grid storage application (e.g., connected to solar panels), the full charge is achieved in the mid-afternoon. Both applications also have predictable downtime available for leakage current testing (e.g., during work hours for electrical vehicles, testing at high SOC; during the night for grid storage systems, testing as low SOC). It should be also noted that the battery pack application may also impact the temperature and other conditions of cells in the battery pack. For example, cells in a battery pack of an electrical vehicle will have a higher temperature variability than cells in a grid storage system, which probably translates into a longer period required to measure changes in OCV, due to temperature-induced noise.

Referring to FIG. 2B, in some examples, method 200 comprises performing (block 290) additional tests on the same or different cells. As noted above, the test may be retested at different SOC, temperature, and other like conditions, e.g., to refine the identification of different degradation mechanisms of these cells. For example, the external cell current is discontinued (block 232) through first battery cell 114 when first battery cell 114 is at a first state. The in-situ leakage current testing of first battery cell 114 is then repeated (loop to block 232 from decision block 290) when first battery cell 114 is at a second state, different from the first state. The first state and the second state may be differentiated by one of the temperature of first battery cell 114 (e.g., first battery cell 114 being retested at a different temperature), the SOC of first battery cell 114 (e.g., first battery cell 114 being retested at a different SOC), and/or prior operation history of first battery cell 114 (e.g., first battery cell 114 being retested after a set number of charge/discharge cycles, after being exposed to certain operating conditions, such as charge/discharge rates and/or temperatures).

Further Examples

Further, the description includes examples according to the following clauses:

Clause 1. A method 230 for in-situ leakage current testing of battery cells in a battery pack 100, the method 230 comprising:

discontinuing an external cell current through a first battery cell 114 of a first battery node 110 while the battery pack 100 remains operational and providing power output; and determining leakage current of the first battery cell 114 based on cell data obtained from the first battery cell 114.

Clause 2. The method 200 of clause 1, wherein the first battery cell 114 is connected to a first node controller 112, and wherein the first node controller 112 is further connected in series or parallel with one or more additional node controllers of the battery pack 100.

Clause 3. The method 200 of clause 2, wherein discontinuing the external cell current through the first battery cell 114 is performed by the first node controller 112.

Clause 4. The method 200 of clause 3, wherein discontinuing the external cell current through the first battery cell 114 comprises closing a bypass switch of the first node controller 112 and bypassing a node current through the bypass switch.

Clause 5. The method 200 of clause 3, wherein discontinuing the external cell current through the first battery cell 114 comprising bypassing a node current through a power converter of the first node controller 112.

Clause 6. The method 200 of any one of clauses 1-5, wherein discontinuing the external cell current through the first battery cell 114 further comprises discontinuing the external cell current through another battery cell of the first battery node 110, connected in series with the first battery cell 114.

Clause 7. The method 200 of any one of clauses 1-6, wherein discontinuing the external cell current through the first battery cell 114 is performed such that a voltage of the battery pack 100 remains substantially unchanged due to power compensation provided by one or more other battery cells in the battery pack 100.

Clause 8. The method 200 of clause 7, wherein at least one of the one or more other battery cells, providing the power compensation, is a part of the first battery node 110.

Clause 9. The method 200 of any one of clauses 7-8, wherein at least one of the one or more other battery cells, providing the power compensation, is a part of a second battery node 120, connected in series with the first battery node 110.

Clause 10. The method 200 of any one of clauses 7-9, wherein the power compensation provided by the one or more other battery cells in the battery pack 100 dynamically changes while the external cell current is discontinued through the first battery cell 114.

Clause 11. The method 200 of any one of clauses 7-10, wherein the power compensation is determined by a battery pack controller 150, communicatively coupled to the first battery node 110 and remaining nodes of the battery pack 100.

Clause 12. The method 230 of any one of clauses 1-11, wherein discontinuing the external cell current through the first battery cell 114 is performed when a state of charge SOC of the first battery cell 114 is within a predetermined range.

Clause 13. The method 230 of any one of clauses 1-12, wherein discontinuing the external cell current through the first battery cell 114 is triggered by a battery pack controller 150, communicatively coupled to a first node controller 112, and
wherein discontinuing the external cell current through the first battery cell 114 is triggered based on at least one of operating history of the first battery cell 114, operating history of the battery pack 100, testing history of the first battery cell 114, testing history of the battery pack 100, SOC of the first battery cell 114, SOC of the battery pack 100, temperature of the first battery cell 114, OCV of the first battery cell 114, voltage of the first battery cell 114 under a given load, or test data analysis of battery cells equivalent to the first battery cell 114.

Clause 14. The method 230 of any one of clauses 1-13, wherein determining the leakage current of the first battery cell 114 comprises monitoring changes in an open circuit voltage OCV of the first battery cell 114 over a time period, while the external cell current is discontinued through the first battery cell 114.

Clause 15. The method 230 of clause 14,
wherein the changes in the OCV are monitored using a first node controller 112, and
wherein the leakage current of the first battery cell 114 is determined from the changes in the by the first node controller 112 or by a battery pack controller 150, communicatively coupled to the first node controller 112.

Clause 16. The method 230 of any one of clauses 14-15, wherein the period is dynamically selected based on the changes in the OCV of the first battery cell 114.

Clause 17. The method 230 of any one of clauses 1-16, further comprising reestablishing the external cell current through the first battery cell 114 while the battery pack 100 remains operational.

Clause 18. The method 230 of clause 17, wherein reestablishing the external cell current through the first battery cell 114 is performed such that voltage of the battery pack 100 remains substantially unchanged based on power compensation provided by one or more additional cells in the battery pack 100.

Clause 19. The method 230 of any one of clauses 17-18, wherein reestablishing the external cell current through the first battery cell 114 is performed when a state of charge SOC of the first battery cell 114 corresponding to a SOC of at least one other battery cell in the battery pack 100.

Clause 20. The method 230 of clause 19, wherein reestablishing the external cell current through the first battery cell 114 is performed after the at least one other battery cell in the battery pack 100 has undergone one or more charge-discharge cycles, while the external cell current has been discontinued through the first battery cell 114.

Clause 21. The method 230 of any one of clauses 17-20, further comprising determining new operating parameters for the first battery cell 114, based on the leakage current of the first battery cell 114, and wherein the external cell current through the first battery cell 114 is reestablished according to the new operating parameters.

Clause 22. The method 230 of any one of clauses 17-21, wherein the external cell current is reestablished at a new level, different from a level, before determining the leakage current.

Clause 23. The method 230 of any one of clauses 1-22, further comprising maintaining the first battery cell 114 disconnected if the leakage current exceeds a set threshold.

Clause 24. The method 230 of any one of clauses 1-23, further comprising setting a timeframe for a new leakage current testing for the first battery cell 114 based on the leakage current.

Clause 25. The method 230 of any one of clauses 1-24, further comprising comparing the leakage current of the first battery cell 114 with prior leakage current data for the first battery cell 114.

Clause 26. The method 230 of any one of clauses 1-25, further comprising determining one or more degradation mechanisms of the first battery cell 114 based on at least the leakage current of the first battery cell 114.

Clause 27. The method 230 of clause 26, wherein determining the one or more degradation mechanisms of the first battery cell 114 comprises comparing the leakage current of the first battery cell 114 with different degradation signatures.

Clause 28. The method 230 of any one of clauses 26-27, wherein the one or more degradation mechanisms comprise at least one of an internal mechanical short, gas evolution, solid electrolyte interface, or metal dendrite formation.

Clause 29. The method 230 of any one of clauses 26-28, wherein the one or more degradation mechanisms is further determined based on at least one of:

temperature of the first battery cell 114 while discontinuing the external cell current through the first battery cell 114, SOC of the first battery cell 114 when discontinuing the external cell current through the first battery cell 114, and operating history of the first battery cell 114 before discontinuing the external cell current through the first battery cell 114.

Clause 30. The method 230 of any one of clauses 1-29, further comprising transmitting data representing the leakage current of the first battery cell 114 from the battery pack 100 to a battery data system 102, communicatively coupled to the battery pack 100.

Clause 31. The method 230 of clause 30, further comprising aggregating the data representing the leakage current of the first battery cell 114 with additional leakage current data, forming at least a portion of aggregate battery data, wherein the battery data system 102 analyzes the aggregate battery data.

Clause 32. The method 230 of clause 31, wherein the additional leakage current data is received by the battery data system 102 from a fleet of power systems comprising additional battery packs, equivalent to the battery pack 100.

Clause 33. The method 230 of any one of clauses 30-32, further comprising receiving, at the battery pack 100 and from the battery data system 102, one or more of a leakage current testing protocol, a power compensation protocol, a cell operating protocol, or a degradation determination protocol.

Clause 34. The method 230 of any one of clauses 1-33, wherein the external cell current is discontinued through the first battery cell 114 when the first battery cell 114 is at a first state, wherein the in-situ leakage current testing of the first battery cell 114 is repeated when the first battery cell 114 is at a second state, different from the first state, and wherein the first state and the second state are differentiated by one of temperature of the first battery cell 114, SOC of the first battery cell 114, or prior operation history of the first battery cell 114.

Clause 35. The method 230 of any one of clauses 1-34, further comprising:

obtaining one or more temperature readings of the first battery cell 114 while the external cell current is discontinued through the first battery cell 114; and correlating the one or more temperature readings to the leakage current of the first battery cell 114.

Clause 36. A battery pack 100, configured for in-situ leakage current testing of battery cells in the battery pack 100, the battery pack 100 comprising:

a first battery node 110, comprising a first node controller 112 and a first battery cell 114, electrically coupled to the first node controller 112, wherein the first node controller 112 is configured to discontinue an external cell current through the first battery cell 114 while the battery pack 100 remains operational and providing power output;

a second battery node 120, comprising a second node controller 122 and a second battery cell 124, electrically coupled to the second node controller 122;

a bus 140, electrically interconnecting the first node controller 112 and the second node controller 122; and a battery pack controller 150, communicatively coupled to the first node controller 112 and the second node controller 122, wherein at least one of the first node controller 112 or battery pack controller 150 is configured to determine leakage current of the first battery cell 114.

Clause 37. The battery pack 100 of clause 36, wherein the battery pack controller 150 is configured to maintain a voltage of the battery pack 100 substantially unchanged while discontinuing the external cell current through the first battery cell 114.

Clause 38. The battery pack 100 of any one of clauses 36-37, wherein the battery pack controller 150 or the first node controller 112 is configured to obtain two or more OCV values from the first battery cell 114 while the external cell current is discontinued through the first battery cell 114, thereby determining the leakage current of the first battery cell 114 from the two or more OCV values.

Clause 39. The battery pack 100 of any one of clauses 36-38, wherein the first node controller 112 comprises a power converter, configured to step-up or to step-down a voltage of the first battery cell 114.

Clause 40. The battery pack 100 of any one of clauses 36-39, wherein the first node controller 112 comprises one or more switches configured to discontinue the external cell current through the first battery cell 114.

Clause 41. The battery pack 100 of clause 40, wherein the one or more switches are configured to bypass an electrical current through the first battery node 110.

Clause 42. The battery pack 100 of any one of clauses 36-41, wherein the first node controller 112 has a quiescent operating current that is at least 10 times lower than expected value of the leakage current of the first battery cell 114.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered as illustrative and not restrictive.

What is claimed is:

1. A method for on-demand in-situ leakage current testing of selected battery cells in a battery pack, the method comprising:

discontinuing an external cell current through a first battery cell of a first battery node using a first node controller, wherein:

the first battery cell is selected from multiple battery cells in the battery pack for purposes of determining leakage current, the first node controller is connected in series with one or more additional node controllers of the battery pack, the one or more additional node controllers control operation of one or more additional cells in the battery pack, and the one or more additional cells continue to charge or discharge according to a power compensation profile to ensure that the power output of the battery pack is substantially unchanged while the external cell current through the first battery cell is discontinued;

obtaining cell data from the first battery cell using the first node controller while discontinuing the external cell current through the first battery cell;

determining the leakage current of the first battery cell based on the cell data; and reestablishing the external cell current through the first battery cell, using the first node controller and switching the one or more additional cells back from the power compensation profile, using the one or more additional node controllers, such that the power output of the battery pack remains substantially unchanged.

2. The method of claim 1, wherein discontinuing the external cell current through the first battery cell is performed when a state of charge (SOC) of the first battery cell is within a predetermined range.

3. The method of claim 1,
wherein discontinuing the external cell current through the first battery cell is triggered by a battery pack controller, communicatively coupled to the first node controller, and
wherein discontinuing the external cell current through the first battery cell is triggered based on at least one of operating history of the first battery cell, operating history of the battery pack, testing history of the first battery cell, testing history of the battery pack, SOC of the first battery cell, SOC of the battery pack, temperature of the first battery cell, OCV of the first battery cell, voltage of the first battery cell under a given load, or test data analysis of battery cells equivalent to the first battery cell.

4. The method of claim 1, wherein the cell data comprises changes in an open circuit voltage (OCV) of the first battery cell over a time period, while the external cell current is discontinued through the first battery cell.

5. The method of claim 4, wherein the time period is dynamically selected based on the changes in the OCV of the first battery cell.

6. The method of claim 1, wherein reestablishing the external cell current through the first battery cell is performed when a state of charge (SOC) of the first battery cell corresponds to a SOC of at least one other battery cell in the battery pack.

7. The method of claim 1, wherein reestablishing the external cell current through the first battery cell is performed after the at least one other battery cell in the battery pack has undergone one or more charge-discharge cycles, while the external cell current has been discontinued through the first battery cell.

8. The method of claim 1, further comprising determining new operating parameters for the first battery cell based on the leakage current of the first battery cell, and wherein the external cell current through the first battery cell is reestablished according to the new operating parameters.

9. The method of claim 1, further comprising determining one or more degradation mechanisms of the first battery cell based on at least the leakage current of the first battery cell.

10. The method of claim 9, wherein determining the one or more degradation mechanisms of the first battery cell comprises comparing the leakage current of the first battery cell with different degradation signatures.

11. The method of claim 9, wherein the one or more degradation mechanisms comprise at least one of an internal mechanical short, gas evolution, solid electrolyte interface, or metal dendrite formation.

12. The method of claim 9, wherein the one or more degradation mechanisms is further determined based on at least one of:
temperature of the first battery cell while discontinuing the external cell current through the first battery cell,
SOC of the first battery cell when discontinuing the external cell current through the first battery cell, and
operating history of the first battery cell before discontinuing the external cell current through the first battery cell.

13. The method of claim 1, further comprising transmitting data representing the leakage current of the first battery cell from the battery pack to a battery data system, communicatively coupled to the battery pack.

14. The method of claim 1,
wherein the external cell current is discontinued through the first battery cell when the first battery cell is at a first state,
wherein the in-situ leakage current testing of the first battery cell is repeated when the first battery cell is at a second state, different from the first state, and
wherein the first state and the second state are differentiated by one of temperature of the first battery cell, SOC of the first battery cell, or prior operation history of the first battery cell.

15. The method of claim 4, wherein the external cell current is discontinued through the first battery cell for a period of time selected based on at least one of the leakage current, desired test accuracy, equipment precision, a type of the first battery cell, temperature of the first battery cell, or a state of charge of the first battery cell.

16. The method of claim 1, wherein the cell data, used for determining the leakage current, is a charge amount used by the first node controller to bring a state of charge of the first battery cell to an initial state of charge at which the external cell current was disconnected through the first battery cell.

17. The method of claim 1, wherein the cell data, which is used for determining the leakage current, is a cell current used by the first node controller to maintain a selected state of charge over time.

18. The method of claim 2, wherein the predetermined range of the state of charge is selected based on one or more degradation mechanisms.

19. The method of claim 14, wherein the first state and the second state correspond to different degradation mechanisms.

20. The method of claim 8, wherein the external cell current through the first battery cell, reestablished according to the new operating parameters, is less than a corresponding external current through at least one of the one or more additional cells in the battery pack.

* * * * *